US012795942B2

(12) United States Patent
Sakuma et al.

(10) Patent No.: US 12,795,942 B2
(45) Date of Patent: Nov. 10, 2026

(54) MEMORY DEVICE

(71) Applicant: Kioxia Corporation, Tokyo (JP)

(72) Inventors: Haruka Sakuma, Yokkaichi Mie (JP); Masumi Saitoh, Yokohama Kanagawa (JP); Kouji Matsuo, Ama Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 421 days.

(21) Appl. No.: 18/588,621

(22) Filed: Feb. 27, 2024

(65) Prior Publication Data

US 2024/0298450 A1 Sep. 5, 2024

(30) Foreign Application Priority Data

Mar. 1, 2023 (JP) ................................. 2023-030620

(51) Int. Cl.
*H10B 53/20* (2023.01)
*H10B 53/10* (2023.01)
(Continued)

(52) U.S. Cl.
CPC ............. *H10B 53/20* (2023.02); *H10B 53/10* (2023.02); *H10D 64/033* (2025.01); *H10D 64/691* (2025.01); *H10W 20/435* (2026.01)

(58) Field of Classification Search
CPC .................... H10B 53/00-50; H10B 51/00-50
See application file for complete search history.

(56) References Cited

U.S. PATENT DOCUMENTS

| | | | |
|---|---|---|---|
| 7,042,749 | B2 | 5/2006 | Nejad et al. |
| 8,633,535 | B2 | 1/2014 | Matsuo et al. |

(Continued)

FOREIGN PATENT DOCUMENTS

| | | | |
|---|---|---|---|
| JP | 2004-152893 | A | 5/2004 |
| JP | 2008-078404 | A | 4/2008 |
| JP | 2009-027136 | A | 2/2009 |

OTHER PUBLICATIONS

A. Hubert, et al., "A stacked SONOS technology, up to 4 levels and 6nm crystalline nanowires, with gate-all-around or independent gates (&#x03A6-Flash), suitable for full 3D integration" 2009 IEEE International Electron Devices Meeting (IEDM), Baltimore, MD, USA, 2009, pp. 637-640 DOI: 10.1109/IEDM.2009.5424260 (4 pages).

(Continued)

*Primary Examiner* — Chad M Dicke
*Assistant Examiner* — Dave Tan
(74) *Attorney, Agent, or Firm* — Foley & Lardner LLP

(57) ABSTRACT

A memory device includes: a first electrode layer extending in a first direction intersecting a surface of a substrate; a second electrode layer extending in the first direction; a first conductive layer surrounding the first electrode layer and the second electrode layer; a first insulating layer between the first electrode layer and the first conductive layer, surrounding the first electrode layer, and including hafnium oxide and/or zirconium oxide; a second insulating layer between the second electrode layer and the first conductive layer, surrounding the second electrode layer, and including hafnium oxide and/or zirconium oxide; a first gate electrode layer extending in the first direction, a first semiconductor layer surrounding the first gate electrode layer and electrically connected to the first conductive layer; and a first gate insulating layer between the first gate electrode layer and the first semiconductor layer and surrounding the first gate electrode layer.

16 Claims, 29 Drawing Sheets

(51) Int. Cl.
*H10D 64/01* (2025.01)
*H10D 64/68* (2025.01)
*H10W 20/41* (2026.01)

(56) References Cited

U.S. PATENT DOCUMENTS

| | | | | |
|---|---|---|---|---|
| 2008/0073635 | A1 | 3/2008 | Kiyotoshi et al. | |
| 2008/0258203 | A1 | 10/2008 | Happ et al. | |
| 2019/0326387 | A1 | 10/2019 | Frank et al. | |
| 2020/0176033 | A1 | 6/2020 | Hosotani et al. | |
| 2021/0111179 | A1 | 4/2021 | Shriram et al. | |
| 2022/0199621 | A1* | 6/2022 | Lee | H10B 12/00 |
| 2022/0302016 | A1 | 9/2022 | Matsuo et al. | |

OTHER PUBLICATIONS

H-T. Lue, et al., "Highly Scalable 8-Layer 3D Vertical-Gate (VG) TFT Nand Flash Using Junction-Free Buried Channel BE-SONOS Device" 2010 Symposium on VLSI Technology Digest of Technical Papers, 2010 Symposium on VLSI Technology, Honolulu, HI, USA, Jun. 15-17, 2010, pp. 131 DOI: 10.1109/VLSIT.2010.5556199 (3 page).

J. Kim et al., "Novel Vertical-Stacked-Array-Transistor (VSAT) for ultra-high-density and cost-effective NAND Flash memory devices and SSD (Solid State Drive)" 2009 Symposium on VLSI Technology, Kyoto, Japan, Jun. 15-17, 2009 (2 pages).

Sou-Chi Chang, et al., "Anti-ferroelectric HfxZr1-xO2 Capacitors for High-density 3-D Embedded-DRAM" 2020 IEEE International Electron Devices Meeting (IEDM), San Francisco, CA, USA, Dec. 12-18, 2020, pp. 28. 1-4; DOI: 10.1109/IEDM13553.2020.9372011 (4 pages).

W. Kim et al., "Multi-Layered Vertical Gate NAND Flash Overcoming Stacking Limit for Terabit Density Storage" 2009 Symposium on VLSI Technology Digest of Technical Papers, 2009 Symposium on VLSI Technology, Honolulu, HI, Jun. 15-17, 2009 (2 pages).

* cited by examiner

AA' CROSS SECTION

AA' CROSS SECTION

AA' CROSS SECTION

AA' CROSS SECTION

AA' CROSS SECTION

MEMORY DEVICE

CROSS-REFERENCE TO RELATED APPLICATION(S)

This application is based upon and claims the benefit of priority from Japanese Patent Application No. 2023-030620, filed Mar. 1, 2023, the entire contents of which are incorporated herein by reference.

FIELD

Embodiments described herein relate generally to a memory device.

BACKGROUND

For a ferroelectric memory using a ferroelectric for memory cells, high-speed operation can be expected by using a short reversal time of the ferroelectric. Further, a high degree of integration can be expected for the ferroelectric memory in which memory cells are three-dimensionally arranged.

DETAILED DESCRIPTION

Figure 1:
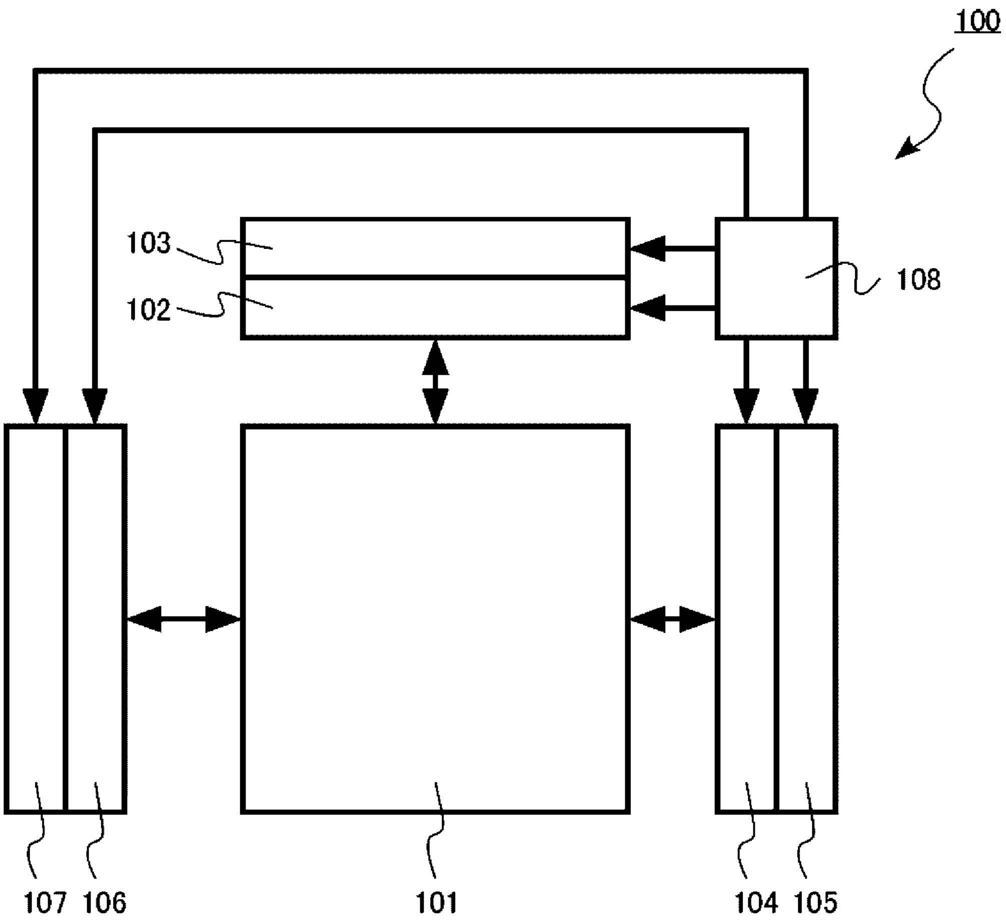
FIG. 1 is a block diagram of a memory device of a first embodiment.

Embodiments provide a memory device capable of being operated at high speed.

In general, according to one embodiment, a memory device includes: a substrate; a first electrode layer extending in a first direction that intersects a surface of the substrate; a second electrode layer extending in the first direction; a first conductive layer surrounding the first electrode layer and the second electrode layer; a first insulating layer provided between the first electrode layer and the first conductive layer, surrounding the first electrode layer, and including oxygen (O) and at least one of hafnium (Hf) or zirconium (Zr); a second insulating layer provided between the second electrode layer and the first conductive layer, surrounding the second electrode layer, and including oxygen (O) and at least one of hafnium (Hf) or zirconium (Zr); a first gate electrode layer extending in the first direction, a first semiconductor layer surrounding the first gate electrode layer and electrically connected to the first conductive layer; and a first gate insulating layer provided between the first gate electrode layer and the first semiconductor layer and surrounding the first gate electrode layer.

Hereinafter, embodiments will be described with reference to the drawings. In the following description, the same reference symbols are allocated to the same or similar components, and a description of components described once is omitted as appropriate. When discrimination between elements labeled with reference symbols having an alphabet at the end thereof for discrimination is not necessitated, the reference symbols in which the alphabet at the end thereof is omitted may be used for description.

A term "upper" or "lower" may be used herein for the sake of convenience. For example, the term "upper" or "lower" represents a relative positional relationship on the drawings. The term "upper" or "lower" does not necessarily define a positional relationship of gravity.

A qualitative analysis and a quantitative analysis of a chemical composition of each component of a memory device herein may be carried out, for example, by secondary ion mass spectroscopy (SIMS), energy dispersive X-ray spectroscopy (EDX), electron energy loss spectroscopy (EELS), or the like. In measurement of the thickness of each component of the memory device, the distance between the components, and the like, for example, a transmission electron microscope (TEM) may be used. In identification of crystal systems of substances constituting the component of the memory device and comparison in the existence ratio between the crystal systems, for example, a transmission electron microscope, x-ray diffraction (XRD), electron beam diffraction (EBD), x-ray photoelectron spectroscopy (XPS), or synchrotron radiation x-ray absorption fine structure (XAFS) may be used.

A "ferroelectric" herein means a substance that is spontaneously polarized (spontaneous polarization) without application of an external electric field and reverses the polarization under application of an external electric field. Herein, an antiferroelectric that does not have spontaneous polarization but has properties the same as those of the ferroelectric under application of a high external electric field also falls within the scope of "ferroelectric". In addition, a ferroelectric also falls within the scope of "ferroelectric".

Herein, a "metal" is the generic term of substances exhibiting metal properties, and metal compounds exhibiting metal properties, such as a metal nitride and a metal carbide, fall within the scope of the "metal".

First Embodiment

A memory device of a first embodiment includes: a substrate; a first electrode layer extending in a first direction that intersects a surface of the substrate; a second electrode layer extending in the first direction; a first conductive layer surrounding the first electrode layer and the second electrode layer; a first insulating layer provided between the first electrode layer and the first conductive layer, surrounding the first electrode layer, and containing at least one element selected from hafnium (Hf) and zirconium (Zr), and oxygen (O); a second insulating layer provided between the second electrode layer and the first conductive layer, surrounding the first electrode layer, and containing at least one element selected from hafnium (Hf) and zirconium (Zr), and oxygen (O); a first gate electrode layer extending in the first direction; a first semiconductor layer surrounding the first gate electrode layer and electrically connected to the first conductive layer; and a first gate insulating layer provided between the first gate electrode layer and the first semiconductor layer and surrounding the first gate electrode layer. In the memory device of the first embodiment, the first gate insulating layer has a charge storage region capable of storing charges.

The memory device of the first embodiment is a three-dimensional ferroelectric memory 100. The three-dimensional ferroelectric memory 100 includes memory cells three-dimensionally arranged. The three-dimensional ferroelectric memory 100 of the first embodiment is a two-terminal ferroelectric memory using as the memory cells ferroelectric capacitors in which a ferroelectric is disposed between metal electrodes. The three-dimensional ferroelectric memory 100 is a nonvolatile memory.

FIG. 1 is a block diagram of the memory device of the first embodiment. FIG. 1 illustrates a circuit configuration of the three-dimensional ferroelectric memory 100 of the first embodiment. As illustrated in FIG. 1, the three-dimensional ferroelectric memory 100 includes a memory cell array 101, a plate line driver circuit 102, a row decoder circuit 103, a sense amplifier circuit 104, a column decoder circuit 105, a word line driver circuit 106, a word line decoder circuit 107, and a control circuit 108.

Figure 2:
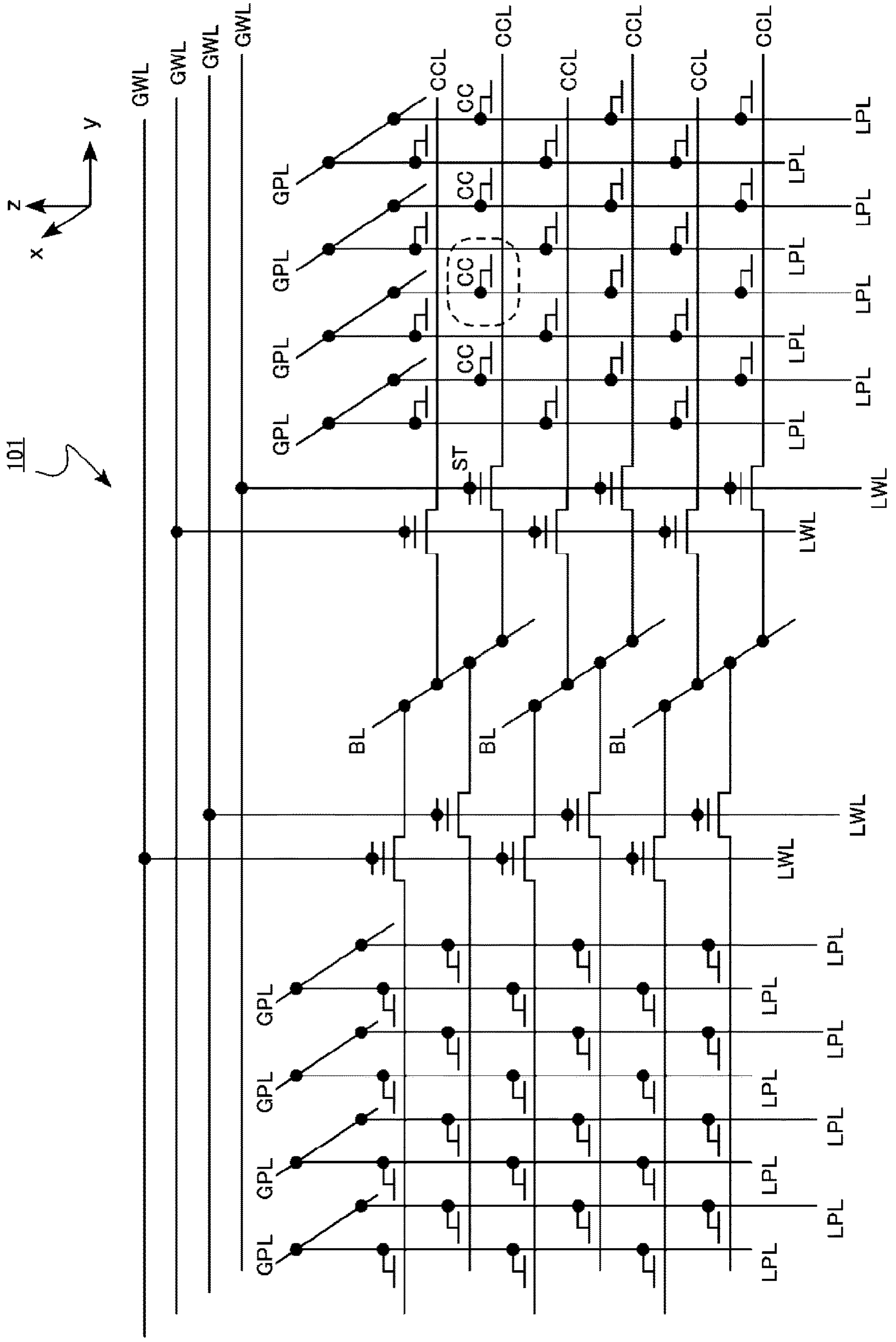
FIG. 2 is an equivalent circuit diagram of a memory cell array in the memory device of the first embodiment.

FIG. 2 is an equivalent circuit diagram of the memory cell array in the memory device of the first embodiment. FIG. 2 schematically illustrates a wiring structure in the memory cell array 101. The memory cell array 101 of the first embodiment has a three-dimensional structure in which a plurality of cell capacitors CCs are sterically arranged.

Hereinafter, an x direction illustrated in FIG. 2 is an example of a second direction. A y direction is an example of a third direction. A z direction is an example of a first direction. The y direction intersects the x direction. The z direction intersects the x direction and the y direction. For example, the x direction is orthogonal to the y direction. For example, the z direction is orthogonal to the x direction and the y direction.

As illustrated in FIG. 2, the memory cell array 101 includes a plurality of cell capacitors CC, a plurality of capacitor connection lines CCL, a plurality of select transistors ST, a plurality of local plate lines LPL, a plurality of global plate lines GPL, a plurality of local word lines LWL, a plurality of global word lines GWL, and a plurality of bit lines BL.

The capacitor connection lines CCL extend, for example, in the y direction. The local plate lines LPL extend, for example, in the z direction. The global plate lines GPL extend, for example, in the x direction. The local word lines LWL extend, for example, in the z direction. The global word lines GWL extend, for example, in the y direction. The bit lines BL extend, for example, in the x direction.

The cell capacitors CC are arranged in the y direction. Each of the cell capacitors CC is a ferroelectric capacitor in which a ferroelectric is disposed between a first metal electrode and a second metal electrode. The first metal electrodes of the cell capacitors CC arranged in the y direction are electrically connected. The first metal electrodes of the cell capacitors CC are electrically connected through the capacitor connection lines CCL. The second metal electrodes of the cell capacitors CC are each electrically connected to a separate one of the local plate lines LPL.

Depending on the polarization state of the ferroelectric of each of the cell capacitors CC, a current is changed under application of a voltage between the first metal electrode and the second metal electrode. For example, a state in which the polarization reversal of the ferroelectric does not occur and the current is low is defined as data "0", and a state in which the polarization reversal of the ferroelectric occurs and the current is high is defined as data "1". The cell capacitors can each store 1-bit data of "0" or "1".

Each of the capacitor connection lines CCL electrically connects the first metal electrodes of the cell capacitors CC. The capacitor connection lines CCL are each connected to source and drain electrodes of each of the select transistors ST.

One of the source and drain electrodes of each of the select transistors ST is electrically connected to the corresponding capacitor connection line CCL. The other of the source and drain electrodes of each of the select transistors ST is electrically connected to the corresponding bit line BL. The gate electrode of each of the select transistors ST is electrically connected to the corresponding local word line LWL. The select transistors ST are controlled by a voltage applied to the local word lines LWL.

The local plate lines LPL are connected to the second metal electrodes of the cell capacitors CC. For example, one of the local plate lines LPL is connected to the second metal electrodes of the cell capacitors CC arranged in the z direction.

The global plate lines GPL are electrically connected to the local plate lines LPL. For example, one of the global plate lines GPL is electrically connected to the local plate lines LPL arranged in the x direction.

The local word lines LWL are electrically connected to the gate electrodes of the select transistors ST. For example, one of the local word lines LWL is electrically connected to the gate electrodes of the select transistors ST arranged in the z direction.

The global word lines GWL are electrically connected to the local word lines LWL. For example, one of the global word lines GWL is electrically connected to the local word lines LWL arranged in the y direction.

The bit lines BL are electrically connected to the source and drain electrodes of the select transistors ST. For example, one of the bit lines BL is electrically connected to the source and drain electrodes of the select transistors ST arranged in the x direction.

The global plate lines GPL are electrically connected to the plate line driver circuit 102. The bit lines BL are connected to the sense amplifier circuit 104.

The row decoder circuit 103 has a function of selecting a specific global plate line GPL according to an input row address signal. The plate line driver circuit 102 has a function of applying a predetermined voltage to the global plate line GPL selected by the row decoder circuit 103.

The column decoder circuit 105 has a function of selecting a bit line BL according to an input column address signal. The sense amplifier circuit 104 has a function of applying a predetermined voltage to the bit line BL selected by the column decoder circuit 105. In addition, the sense amplifier circuit 104 has a function of detecting and amplifying a current flowing through the selected bit line BL or the voltage.

The word line decoder circuit 107 has a function of selecting a specific global word line GWL according to an input word line address signal. The word line driver circuit 106 has a function of applying a predetermined voltage to the global word line GWL selected by the word line decoder circuit 107.

The control circuit 108 has a function of controlling the plate line driver circuit 102, the row decoder circuit 103, the sense amplifier circuit 104, the column decoder circuit 105, the word line driver circuit 106, the word line decoder circuit 107, and another circuit not shown.

For example, circuits, such as the plate line driver circuit 102, the row decoder circuit 103, the sense amplifier circuit 104, the column decoder circuit 105, the word line driver circuit 106, and the word line decoder circuit 107, are implemented by transistors using semiconductor layers and wiring layers not shown.

In FIG. 2, for example, when data stored in the cell capacitor CC surrounded by a dashed line is read out, the select transistor ST connected to the selected cell capacitor CC is turned on. When an on voltage is applied to the local word line LWL connected to the gate electrode of the select transistor ST, the select transistor ST is turned on. To the local word line LWL, the on voltage from the global word line GWL is applied.

When the select transistor ST is in the on state, the bit line BL is brought into conduction through the capacitor connection line CCL connected to the first metal electrode of the selected cell capacitor CC.

A reading voltage is then applied to the local plate line LPL connected to the second metal electrode of the cell capacitor CC. To the local plate line LPL, a reading voltage from the global plate line GPL is applied.

According to the polarization state of the ferroelectric of the cell capacitor CC, a current flows between the bit line BL and the local plate line LPL. On the basis of the current flowing between the bit line BL and the local plate line LPL, the data stored in the cell capacitor CC is determined.

For example, the current flowing through the bit line BL is amplified by the sense amplifier circuit 104, and the data stored in the cell capacitor CC is determined by the control circuit 108. Alternatively, a change in voltage of the bit line BL is amplified by the sense amplifier circuit 104, and the data stored in the cell capacitor CC is determined by the control circuit 108.

FIG. 2 illustrates a case in which four cell capacitors CCs are connected to one capacitor connection line CCL. However, the number of cell capacitors CCs connected to one capacitor connection line CCL is not limited to four.

Figure 3:
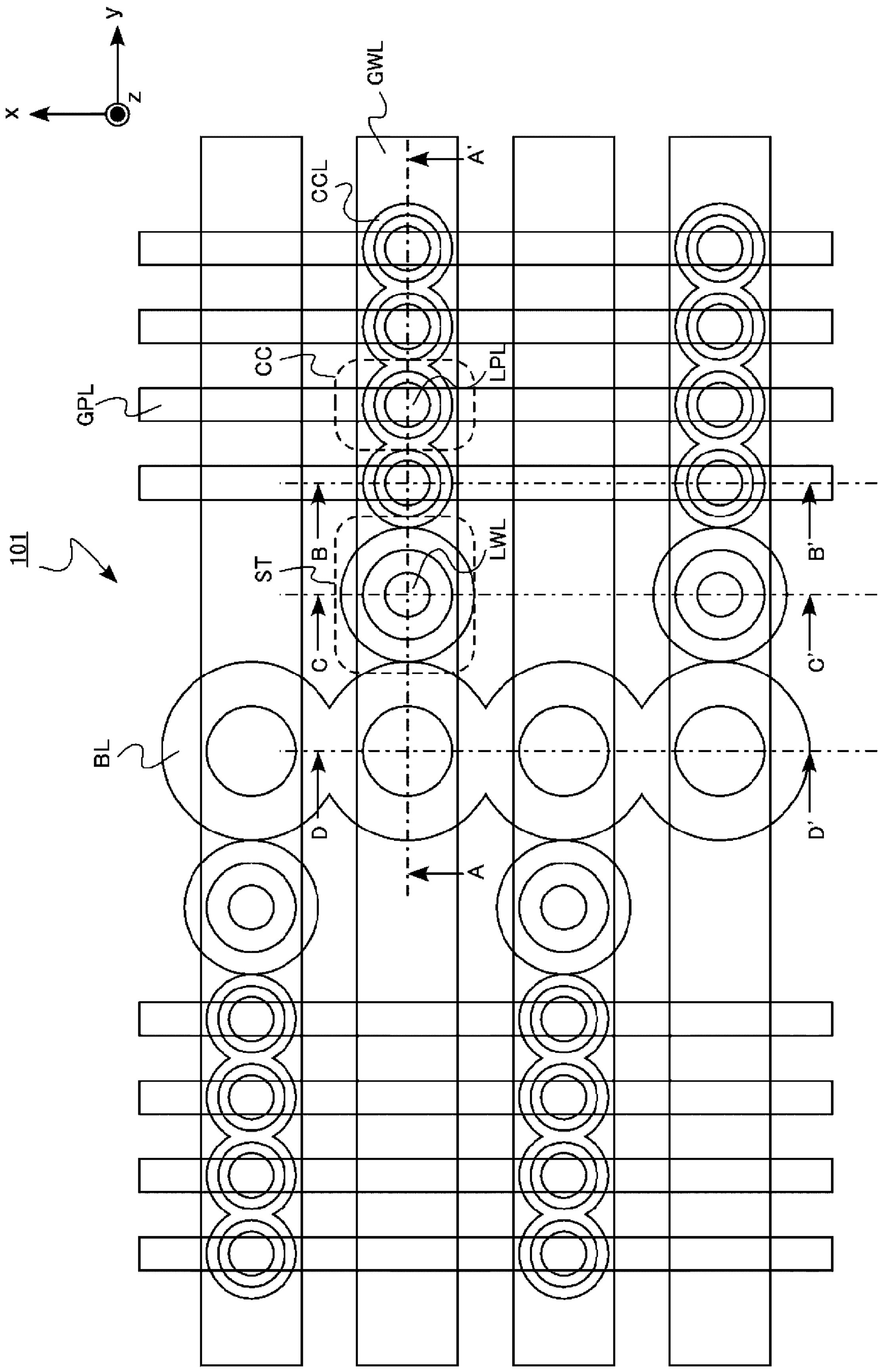
FIG. 3 is a pattern layout of the memory cell array in the memory device of the first embodiment.

FIG. 3 is a pattern layout of the memory cell array in the memory device of the first embodiment. FIG. 3 illustrates a pattern layout of each wiring of the memory cell array 101 illustrated in FIG. 2. FIG. 3 is a view projecting the pattern of the wiring to an xy plane.

FIGS. 4 to 8 are schematic cross-sectional views of the memory device of the first embodiment. FIGS. 4 to 8 are cross-sectional views of the memory cell array 101 in the three-dimensional ferroelectric memory 100 of the first embodiment.

Figure 4:
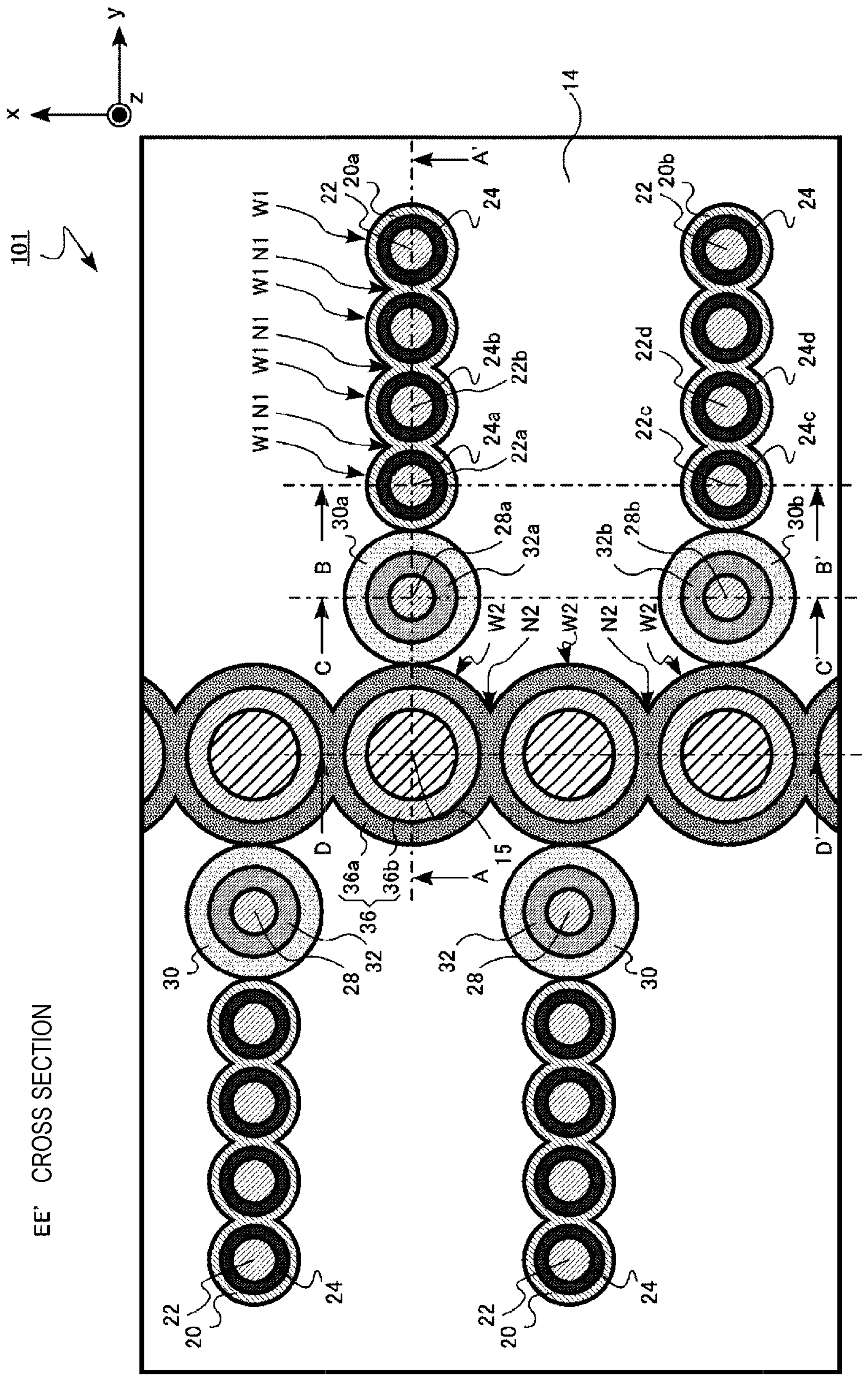
FIG. 4 is a schematic cross-sectional view of the memory device of the first embodiment.

FIG. 4 is a cross-sectional view that is parallel to the xy plane. FIG. 4 is a cross-sectional view that is perpendicular to the z direction. FIG. 4 is a cross section taken along a line EE' in FIG. 5. FIG. 4 is a cross section corresponding to the layout pattern of FIG. 3.

Figure 5:
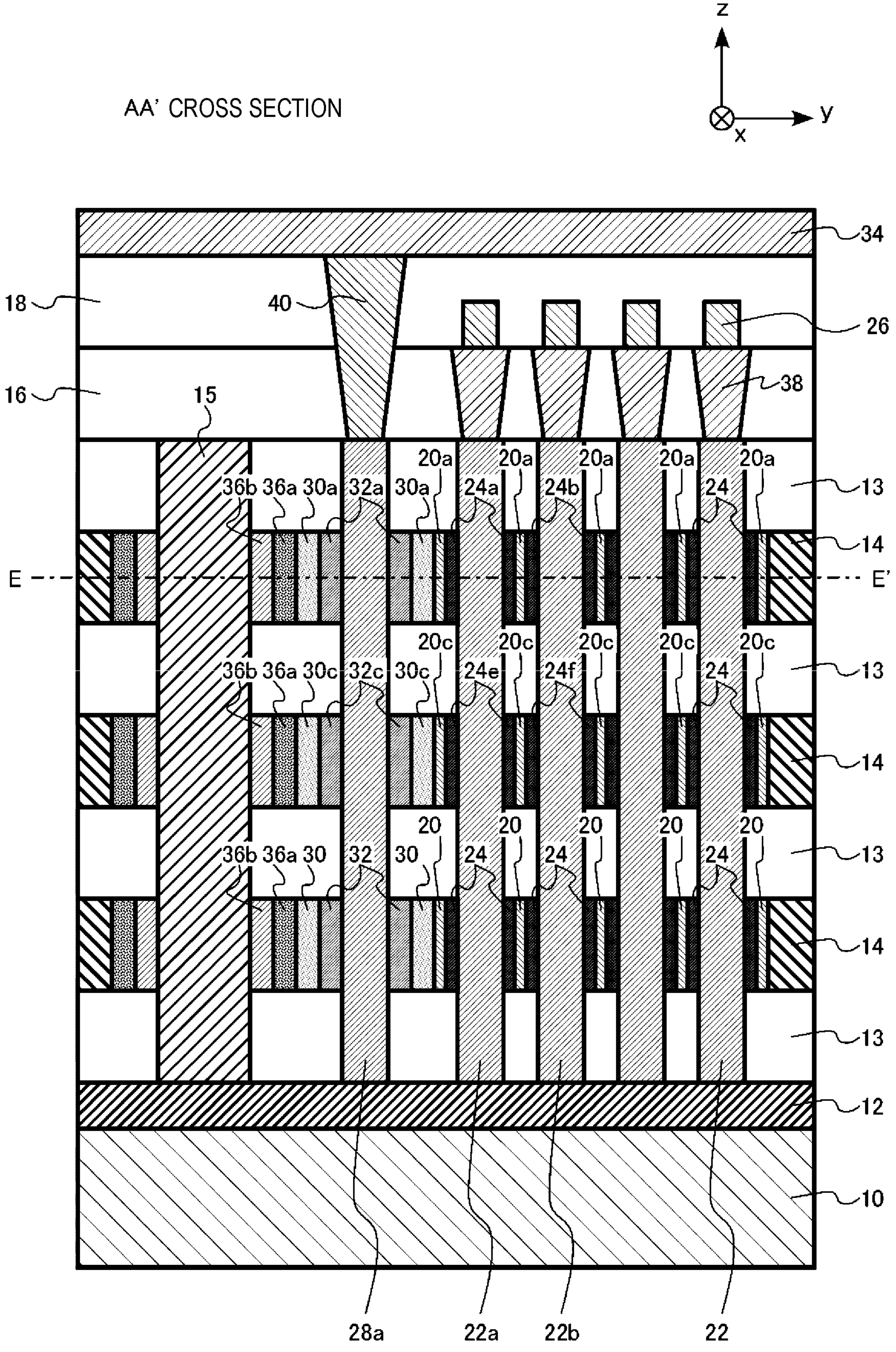
FIG. 5 is a schematic cross-sectional view of the memory device of the first embodiment.

FIG. 5 is a cross-sectional view that is parallel to a yz plane. FIG. 5 is a cross section taken along a line AA' in FIGS. 3 and 4.

Figure 6:
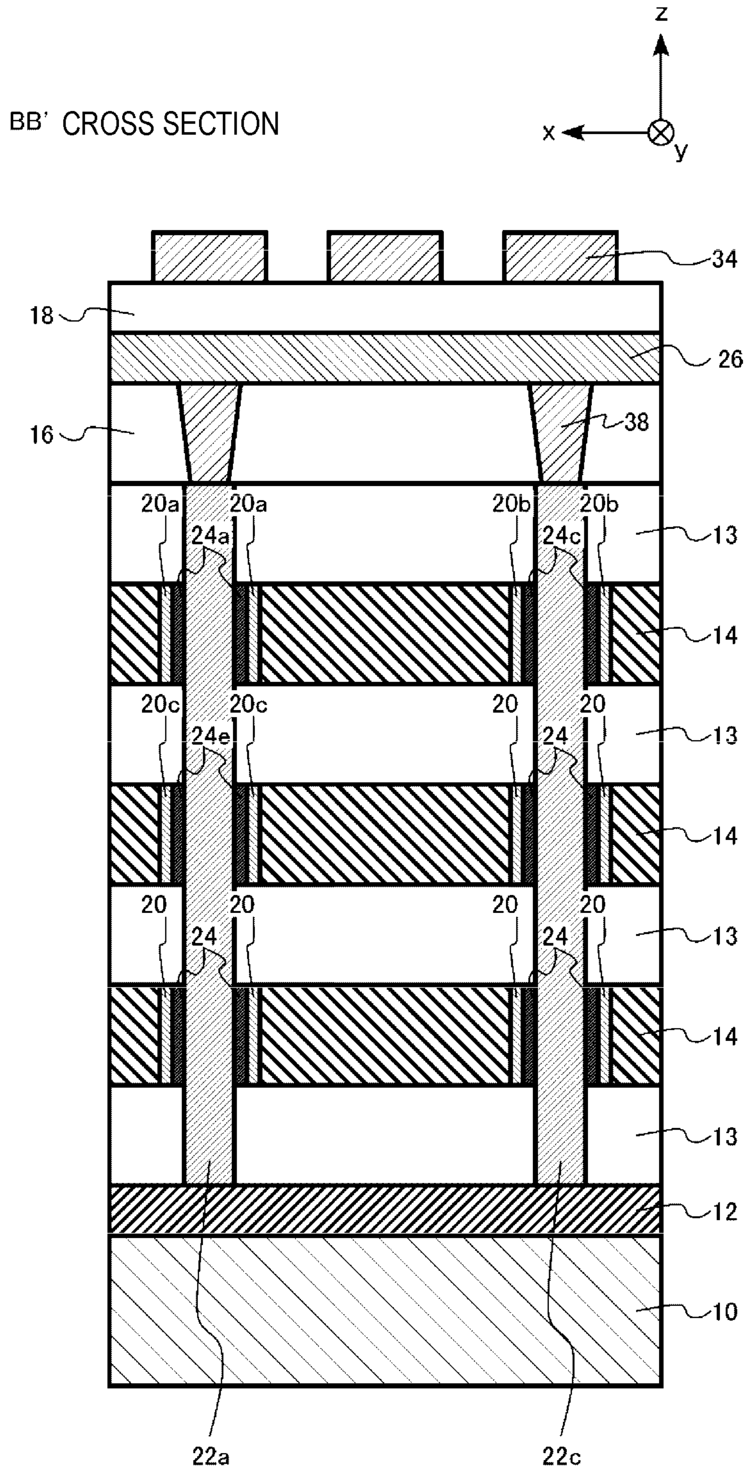
FIG. 6 is a schematic cross-sectional view of the memory device of the first embodiment.

FIG. 6 is a cross-sectional view that is parallel to an xz plane. FIG. 6 is a cross section taken along a line BB' in FIGS. 3 and 4.

Figure 7:
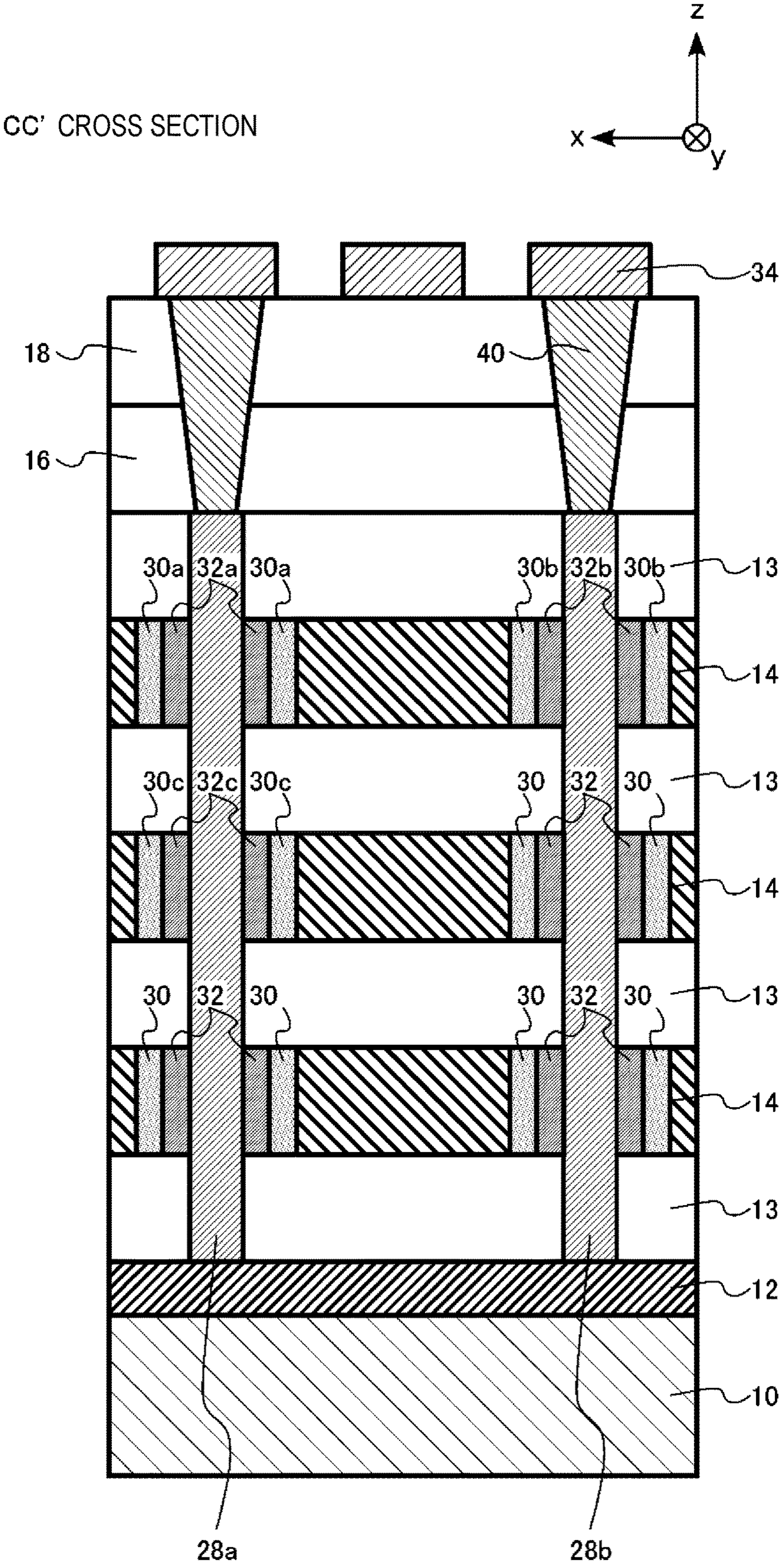
FIG. 7 is a schematic cross-sectional view of the memory device of the first embodiment.

FIG. 7 is a cross-sectional view that is parallel to the xz plane. FIG. 7 is a cross section taken along a line CC' in FIGS. 3 and 4.

Figure 8:
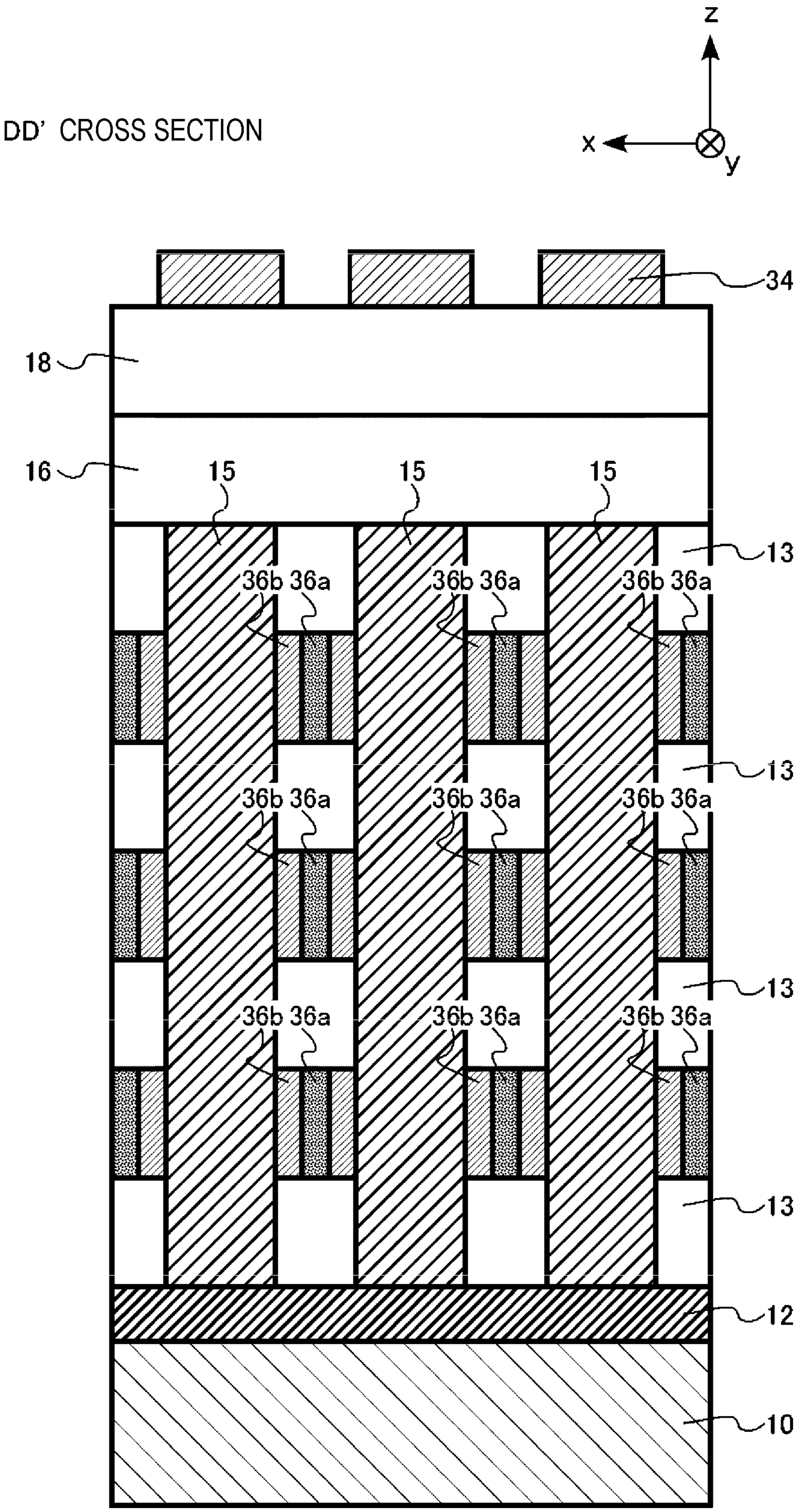
FIG. 8 is a schematic cross-sectional view of the memory device of the first embodiment.

FIG. 8 is a cross-sectional view that is parallel to the xz plane. FIG. 8 is a cross section taken along a line in DD' in FIGS. 3 and 4.

The memory cell array 101 includes a semiconductor substrate 10, a substrate insulating layer 12, a first interlayer insulating layer 13, a second interlayer insulating layer 14, a core insulating region 15, a first wiring insulating layer 16, a second wiring insulating layer 18, a capacitor connection line layer 20, a plate electrode layer 22, a capacitor insulating layer 24, a plate wiring layer 26, a gate electrode layer 28, a channel semiconductor layer 30, a gate insulating layer 32, a gate wiring layer 34, a bit line layer 36, a first contact plug 38, and a second contact plug 40.

The semiconductor substrate 10 is an example of a substrate. The core insulating region 15 is an example of an insulating region.

The capacitor connection line layer 20 includes a first capacitor connection line layer 20*a*, a second capacitor connection line layer 20*b*, and a third capacitor connection line layer 20*c*. The first capacitor connection line layer 20*a* is an example of a first conductive layer. The second capacitor connection line layer 20*b* is an example of a second conductive layer. The third capacitor connection line layer 20*c* is an example of a third conductive layer.

The plate electrode layer 22 includes a first plate electrode layer 22*a*, a second plate electrode layer 22*b*, a third plate electrode layer 22*c*, and a fourth plate electrode layer 22*d*. The first plate electrode layer 22*a* is an example of a first electrode layer. The second plate electrode layer 22*b* is an example of a second electrode layer. The third plate electrode layer 22*c* is an example of a third electrode layer. The fourth plate electrode layer 22*d* is an example of a fourth electrode layer.

The capacitor insulating layer 24 includes a first capacitor insulating layer 24*a*, a second capacitor insulating layer 24*b*, a third capacitor insulating layer 24*c*, a fourth capacitor insulating layer 24*d*, a fifth capacitor insulating layer 24*e*, and a sixth capacitor insulating layer 24*f*. The first capacitor insulating layer 24*a* is an example of a first insulating layer. The second capacitor insulating layer 24*b* is an example of a second insulating layer. The third capacitor insulating layer 24*c* is an example of a third insulating layer. The fourth capacitor insulating layer 24*d* is an example of a fourth insulating layer. The fifth capacitor insulating layer 24*e* is an example of a fifth insulating layer. The sixth capacitor insulating layer 24*f* is an example of a sixth insulating layer.

The gate electrode layer 28 includes a first gate electrode layer 28*a* and a second gate electrode layer 28*b*.

The channel semiconductor layer 30 includes a first channel semiconductor layer 30*a*, a second channel semiconductor layer 30*b*, and a third channel semiconductor layer 30*c*. The first channel semiconductor layer 30*a* is an example of a first semiconductor layer. The second channel semiconductor layer 30*b* is an example of a second semiconductor layer. The third channel semiconductor layer 30*c* is an example of a third semiconductor layer.

The gate insulating layer 32 includes a first gate insulating layer 32*a*, a second gate insulating layer 32*b*, and a third gate insulating layer 32*c*.

The bit line layer 36 includes a bit line semiconductor layer 36*a* and a bit line metal layer 36*b*. The bit line layer 36 is an example of a wiring layer.

The semiconductor substrate 10 is, for example, single crystal silicon. The semiconductor substrate 10 is, for example, a silicon substrate. The semiconductor substrate 10 has a surface parallel to the x direction and the y direction. A direction perpendicular to the surface of the semiconductor substrate 10 is the z direction.

The substrate insulating layer 12 is provided on the semiconductor substrate 10. The substrate insulating layer 12 contains, for example, aluminum oxide or silicon oxide. The substrate insulating layer 12 is, for example, an aluminum oxide layer or a silicon oxide layer.

The first interlayer insulating layer 13 and the second interlayer insulating layer 14 are provided above the substrate insulating layer 12. The first interlayer insulating layer 13 and the second interlayer insulating layer 14 are repeatedly disposed in an alternating manner in the z direction.

The first interlayer insulating layer 13 is an insulator. The first interlayer insulating layer 13 is, for example, an oxide, an oxynitride, or a nitride. The first interlayer insulating layer 13 contains, for example, silicon oxide. The first interlayer insulating layer 13 is, for example, a silicon oxide layer. The thickness of the first interlayer insulating layer 13 in the z direction is, for example, 5 nm or more and 30 nm or less.

The second interlayer insulating layer 14 is an insulator. The second interlayer insulating layer 14 contains a material different from the first interlayer insulating layer 13. The second interlayer insulating layer 14 is, for example, an oxide, an oxynitride, or a nitride. The second interlayer insulating layer 14 contains, for example, silicon nitride. The second interlayer insulating layer 14 is, for example, a silicon nitride layer. The thickness of the second interlayer insulating layer 14 in the z direction is, for example, 5 nm or more and 30 nm or less.

The plate electrode layer 22 extends in a direction that intersects the surface of the substrate insulating layer 12. The plate electrode layer 22 extends, for example, in the z direction.

For example, a plurality of the plate electrode layers 22 are arranged in the y direction. For example, the second plate electrode layer 22*b* is apart from the first plate electrode layer 22*a* in the y direction. For example, the first plate electrode layer 22*a* is provided between the second plate electrode layer 22*b* and the first gate electrode layer 28*a*. For example, the fourth plate electrode layer 22*d* is apart from the third plate electrode layer 22*c* in the y direction. For example, the third plate electrode layer 22*c* is apart from the first plate electrode layer 22*a* in the x direction. For example, the fourth plate electrode layer 22*d* is apart from the second plate electrode layer 22*b* in the x direction.

The plate electrode layer 22 corresponds to the local plate line LPL in FIG. 2. The plate electrode layer 22 functions as one electrode of the cell capacitor CC.

The plate electrode layer 22 is columnar. The plate electrode layer 22 is, for example, cylindrical.

The plate electrode layer 22 is a conductor. The plate electrode layer 22 contains, for example, a metal. The plate electrode layer 22 is, for example, titanium nitride or tungsten.

The capacitor connection line layer 20 surrounds a plurality of the plate electrode layers 22. For example, the first capacitor connection line layer 20*a* surrounds the first plate electrode layer 22*a* and the second plate electrode layer 22*b*. For example, the second capacitor connection line layer 20*b* surrounds the third plate electrode layer 22*c* and the fourth plate electrode layer 22*d*. For example, the third capacitor connection line layer 20*c* surrounds the first plate electrode layer 22*a* and the second plate electrode layer 22*b*.

The capacitor connection line layer 20 extends, for example, in a direction along the surface of the substrate insulating layer 12. The capacitor connection line layer 20 extends, for example, in the y direction.

For example, the second capacitor connection line layer 20*b* is provided in the x direction of the first capacitor connection line layer 20*a*. For example, the third capacitor connection line layer 20*c* is provided in the z direction of the first capacitor connection line layer 20*a*.

The capacitor connection line layer 20 has, for example, a wide-width portion and a narrow-width portion. For example, the wide-width portion and the narrow-width portion are alternately provided in the y direction.

For example, as illustrated in FIG. 4, the first capacitor connection line layer 20*a* has a first wide-width portion W1 and a first narrow-width portion N1. The first wide-width portion W1 is an example of a first portion. The first narrow-width portion N1 is an example of a second portion.

The first wide-width portion W1 and the first narrow-width portion N1 are alternately provided in the y direction. The width in the x direction of the first wide-width portion W1 is larger than the width in the x direction of the first narrow-width portion N1.

The width in the x direction of the first wide-width portion W1 and the width in the x direction of the first narrow-width portion N1 each mean the distance of a line in the x direction that connects two points on the outer edge of the first capacitor connection line layer 20*a*. In other words, the width in the x direction of the first wide-width portion W1 and the width in the x direction of the first narrow-width portion N1 each mean the distance of a line in the x direction that connects two points on the boundary between the first capacitor connection line layer 20*a* and the second interlayer insulating layer 14.

The capacitor connection line layer 20 corresponds to the capacitor connection line CCL in FIG. 2. The capacitor connection line layer 20 functions as the other electrode of the cell capacitor CC.

The capacitor connection line layer 20 is a conductor. The capacitor connection line layer 20 contains, for example, a metal. The capacitor connection line layer 20 is, for example, a metal. The capacitor connection line layer 20 is, for example, titanium nitride or tungsten.

The capacitor insulating layer 24 is provided between the plate electrode layer 22 and the capacitor connection line layer 20. The capacitor insulating layer 24 surrounds the plate electrode layer 22. For example, the plate electrode layer 22 is in contact with the capacitor insulating layer 24.

For example, the first capacitor insulating layer 24*a* is provided between the first plate electrode layer 22*a* and the first capacitor connection line layer 20*a*. For example, the first capacitor insulating layer 24*a* surrounds the first plate electrode layer 22*a*.

For example, the second capacitor insulating layer 24*b* is provided between the second plate electrode layer 22*b* and the first capacitor connection line layer 20*a*. For example, the second capacitor insulating layer 24*b* surrounds the second plate electrode layer 22*b*.

For example, the third capacitor insulating layer 24*c* is provided between the third plate electrode layer 22*c* and the second capacitor connection line layer 20*b*. For example, the third capacitor insulating layer 24*c* surrounds the third plate electrode layer 22*c*.

For example, the fourth capacitor insulating layer 24*d* is provided between the fourth plate electrode layer 22*d* and the second capacitor connection line layer 20*b*. For example, the fourth capacitor insulating layer 24*d* surrounds the fourth plate electrode layer 22*d*.

For example, the fifth capacitor insulating layer 24*e* is provided between the first plate electrode layer 22*a* and the third capacitor connection line layer 20*c*. For example, the fifth capacitor insulating layer 24*e* surrounds the first plate electrode layer 22*a*.

For example, the sixth capacitor insulating layer 24*f* is provided between the second plate electrode layer 22*b* and the third capacitor connection line layer 20*c*. For example, the sixth capacitor insulating layer 24*f* surrounds the second plate electrode layer 22*b*.

The capacitor insulating layer 24 contains at least one element selected from hafnium (Hf) and zirconium (Zr), and oxygen (O).

For example, the capacitor insulating layer 24 contains hafnium (Hf) and oxygen (O) as main components. The capacitor insulating layer 24 containing hafnium (Hf) and oxygen (O) as main components means that there is no element having a higher composition ratio (at %) than hafnium (Hf) or oxygen (O) in the capacitor insulating layer 24. The sum of the composition ratios of hafnium (Hf) and oxygen (O) in the capacitor insulating layer 24 is, for example, 90 at % or more.

The capacitor insulating layer 24 contains, for example, hafnium oxide. The capacitor insulating layer 24 contains, for example, hafnium oxide as a main component. The capacitor insulating layer 24 containing hafnium oxide as a main component means that the mole fraction of hafnium oxide is the highest of substances in the capacitor insulating layer 24. The mole fraction of hafnium oxide is, for example, 90 mol % or more.

The capacitor insulating layer 24 contains, for example, zirconium oxide. The capacitor insulating layer 24 contains, for example, zirconium oxide as a main component. The capacitor insulating layer 24 containing zirconium oxide as a main component means that the mole fraction of zirconium oxide is the highest of substances in the capacitor insulating layer 24. The mole fraction of zirconium oxide is, for example, 90 mol % or more.

The capacitor insulating layer 24 contains a ferroelectric. The capacitor insulating layer 24 is, for example, a ferroelectric.

The capacitor insulating layer 24 contains an orthorhombic or trigonal crystal. When hafnium oxide is an orthorhombic or trigonal crystal, the capacitor insulating layer 24 has ferroelectricity. When hafnium oxide is an orthorhombic or trigonal crystal, the capacitor insulating layer 24 is a ferroelectric.

When hafnium oxide having ferroelectricity is, for example, a third orthorhombic (orthorhombic III, space group $Pbc2_1$, space group number: 29) crystal or a trigonal (trigonal, space group R3m, P3, or R3, space group number: 160, 143, or 146) crystal, the capacitor insulating layer 24 has ferroelectricity When hafnium oxide is a crystal other than an orthorhombic or trigonal crystal or is amorphous, the capacitor insulating layer 24 does not have ferroelectricity. When hafnium oxide is a crystal other than an orthorhombic or trigonal crystal or is amorphous, the capacitor insulating layer 24 is a paraelectric. A crystal system other than an orthorhombic or trigonal system is a cubic system, a hexagonal system, a tetragonal system, a monoclinic system, or a triclinic system.

When zirconium oxide having ferroelectricity is, for example, a third orthorhombic (orthorhombic III, space group $Pbc2_1$, space group number: 29) crystal or a trigonal (trigonal, space group R3m, P3, or R3, space group number: 160, 143, or 146) crystal, the capacitor insulating layer 24 has ferroelectricity When zirconium oxide is a crystal other than an orthorhombic or trigonal crystal or is amorphous, the capacitor insulating layer 24 does not have ferroelectricity. When zirconium oxide is a crystal other than an orthorhombic or trigonal crystal or is amorphous, the capacitor insulating layer 24 is a paraelectric. A crystal system other than an orthorhombic or trigonal system is a cubic system, a hexagonal system, a tetragonal system, a monoclinic system, or a triclinic system.

The capacitor insulating layer 24 contains, for example, at least additional element selected from the group consisting of silicon (Si), aluminum (Al), titanium (Ti), vanadium (V), niobium (Nb), tantalum (Ta), strontium (Sr), scandium (Sc), yttrium (Y), lanthanum (La), samarium (Sm), gadolinium (Gd), terbium (Tb), dysprosium (Dy), holmium (Ho), erbium (Er), ytterbium (Yb), lutetium (Lu), and barium (Ba). Due to the additional element contained, hafnium oxide and zirconium oxide are likely to express ferroelectricity.

The thickness of the capacitor insulating layer 24 on the cross section parallel to the xy plane is, for example, 3 nm or more and 30 nm or less.

The gate electrode layer 28 extends in the direction that intersects the surface of the substrate insulating layer 12. The gate electrode layer 28 extends, for example, in the z direction. The gate electrode layer 28 extends in the same direction as the extending direction of the plate electrode layer 22.

The gate electrode layer 28 corresponds to the local word line LWL in FIG. 2. The gate electrode layer 28 functions as the gate electrode of the select transistor ST.

The gate electrode layer 28 is columnar. The gate electrode layer 28 is, for example, cylindrical.

The gate electrode layer 28 is a conductor. The gate electrode layer 28 contains, for example, a metal. The gate electrode layer 28 is, for example, titanium nitride or tungsten.

For example, the first gate electrode layer 28*a* is electrically separated from the second gate electrode layer 28*b*.

The channel semiconductor layer 30 surrounds the gate electrode layer 28. For example, the first channel semiconductor layer 30*a* surrounds the first gate electrode layer 28*a*. For example, the second channel semiconductor layer 30*b* surrounds the second gate electrode layer 28*b*. For example, the third channel semiconductor layer 30*c* surrounds the first gate electrode layer 28*a*.

The first channel semiconductor layer 30*a* and the second channel semiconductor layer 30*b* are apart from each other, for example, in the x direction. The first channel semiconductor layer 30*a* and the third channel semiconductor layer 30*c* are apart from each other, for example, in the z direction.

The channel semiconductor layer 30 is electrically connected to the capacitor connection line layer 20. For example, the first channel semiconductor layer 30*a* is electrically connected to the first capacitor connection line layer 20*a*. For example, the second channel semiconductor layer 30*b* is electrically connected to the second capacitor connection line layer 20*b*. For example, the third channel semiconductor layer 30*c* is electrically connected to the third capacitor connection line layer 20*c*.

For example, the channel semiconductor layer 30 is in contact with the capacitor connection line layer 20. For example, the first channel semiconductor layer 30*a* is in contact with the first capacitor connection line layer 20*a*. For example, the second channel semiconductor layer 30*b* is in contact with the second capacitor connection line layer 20*b*. For example, the third channel semiconductor layer 30*c* is in contact with the third capacitor connection line layer 20*c*.

When the select transistor ST is in the on state, the channel semiconductor layer 30 forms a channel.

The channel semiconductor layer 30 contains a semiconductor. The channel semiconductor layer 30 contains, for example, silicon. The channel semiconductor layer 30 is, for example, polycrystalline silicon.

The gate insulating layer 32 is provided between the gate electrode layer 28 and the channel semiconductor layer 30. The gate insulating layer 32 surrounds the gate electrode layer 28.

For example, the first gate insulating layer 32*a* is provided between the first gate electrode layer 28*a* and the first channel semiconductor layer 30*a*. For example, the first gate insulating layer 32*a* surrounds the first gate electrode layer 28*a*.

For example, the second gate insulating layer 32*b* is provided between the second gate electrode layer 28*b* and the second channel semiconductor layer 30*b*. For example, the second gate insulating layer 32*b* surrounds the second gate electrode layer 28*b*.

For example, the third gate insulating layer 32*c* is provided between the third gate electrode layer 28*c* and the third channel semiconductor layer 30*c*. For example, the third gate insulating layer 32*c* surrounds the first gate electrode layer 28*a*.

The gate insulating layer 32 functions as the gate insulating layer of the select transistor ST.

The thickness of the gate insulating layer 32 on the cross section parallel to the xy plane is, for example, 3 nm or more and 30 nm or less.

Figure 9:
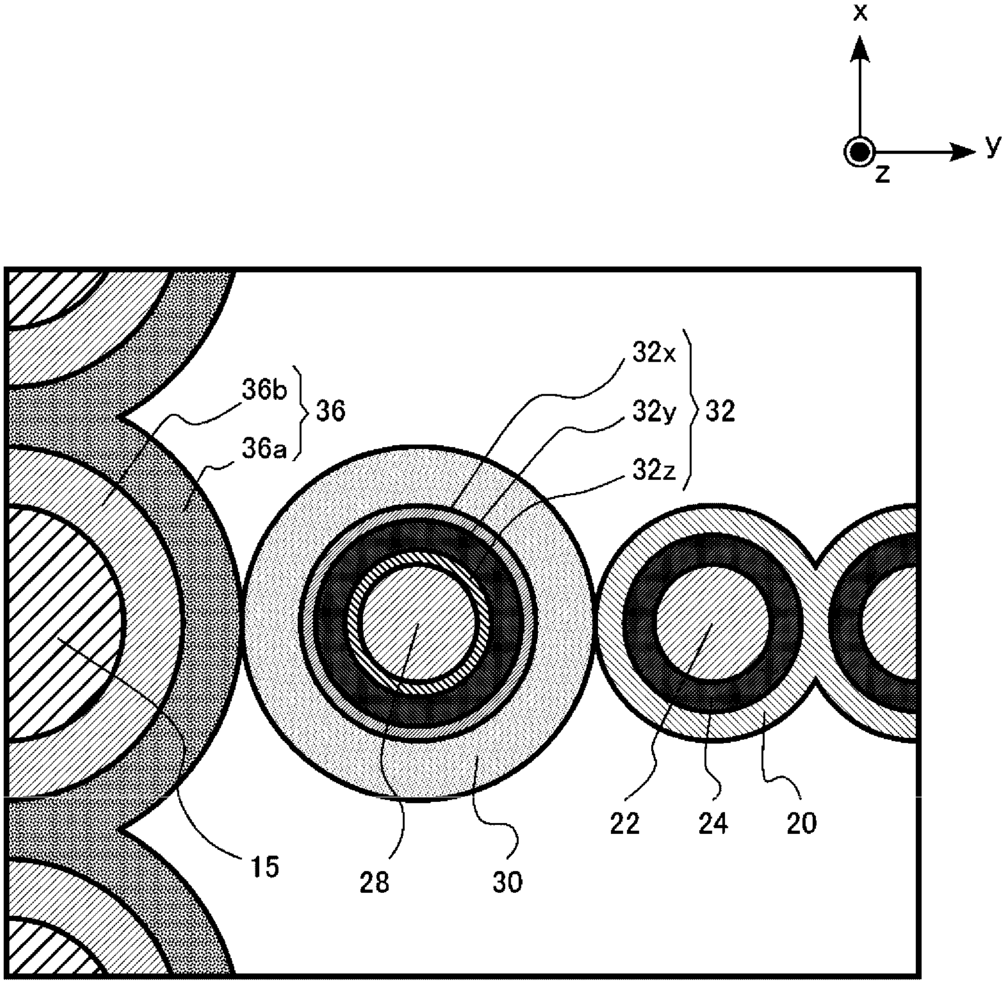
FIG. 9 is a schematic enlarged cross-sectional view of a portion of the memory device of the first embodiment.

FIG. 9 is a schematic enlarged cross-sectional view of a portion of the memory device of the first embodiment. FIG. 9 is a schematic enlarged cross-sectional view of a portion of FIG. 4. FIG. 9 is a cross-sectional view including the gate electrode layer 28, the channel semiconductor layer 30, and the gate insulating layer 32.

The gate insulating layer 32 includes a tunnel insulating film 32*x*, a charge storage region 32*y*, and a block insulating film 32*z*.

The tunnel insulating film 32*x* is provided between the channel semiconductor layer 30 and the gate electrode layer 28. The tunnel insulating film 32*x* surrounds the gate electrode layer 28. The tunnel insulating film 32*x* is provided between the channel semiconductor layer 30 and the charge storage region 32*y*. The tunnel insulating film 32*x* is in contact with the channel semiconductor layer 30. The tunnel insulating film 32*x* is in contact with the charge storage region 32*y*.

The tunnel insulating film 32*x* has a function of passing charges according to the voltage applied between the gate electrode layer 28 and the channel semiconductor layer 30.

The tunnel insulating film 32*x* contains, for example, silicon oxide, silicon nitride, or silicon oxynitride. The tunnel insulating film 32*x* is, for example, a silicon oxide film.

The charge storage region 32*y* is provided between the tunnel insulating film 32*x* and the gate electrode layer 28. The charge storage region 32*y* is provided between the tunnel insulating film 32*x* and the block insulating film 32*z*. The charge storage region 32*y* is in contact with the tunnel insulating film 32*x*. The charge storage region 32*y* is in contact with the block insulating film 32*z*.

The charge storage region 32*y* has a function of storing charges. For example, the charges are electrons. The threshold voltage of the select transistors ST is changed according to the amount of the charge stored in the charge storage region 32*y*. When the charge storage region 32*y* is provided, the threshold voltage of the select transistors ST can be adjusted.

The charge storage region 32*y* is an insulator or a conductor. The charge storage region 32*y* contains, for example, silicon nitride. The charge storage region 32*y* is, for example, silicon nitride. The charge storage region 32*y* contains, for example, polycrystalline silicon. The charge storage region 32*y* is, for example, polycrystalline silicon.

The block insulating film 32*z* is provided between the charge storage region 32*y* and the gate electrode layer 28. The block insulating film 32*z* is in contact with the charge storage region 32*y*. The block insulating film 32*z* is in contact with the gate electrode layer 28.

The block insulating film 32*z* has a function of preventing a current flowing between the charge storage region 32*y* and the gate electrode layer 28.

The block insulating film 32*z* is, for example, an oxide, an oxynitride, or a nitride. The block insulating film 32*z* contains, for example, silicon oxide. The block insulating film 32*z* is, for example, silicon oxide.

The bit line layer 36 extends, for example, along the surface of the semiconductor substrate 10. The bit line layer 36 extends, for example, in the x direction. The bit line layer 36 is electrically connected to the channel semiconductor layer 30.

For example, the bit line layer 36 is in contact with the channel semiconductor layer 30. For example, the bit line layer 36 is in contact with the first channel semiconductor layer 30*a* and the second channel semiconductor layer 30*b*.

The bit line layer 36 surrounds, for example, the core insulating region 15.

The bit line layer 36 corresponds to the bit line BL of FIG. 2.

The bit line layer 36 includes the bit line semiconductor layer 36*a* and the bit line metal layer 36*b*. The bit line layer 36 has a stacked structure including the bit line semiconductor layer 36*a* and the bit line metal layer 36*b*. The bit line semiconductor layer 36*a* is in contact with the bit line metal layer 36*b*.

For example, the bit line semiconductor layer 36*a* surrounds a plurality of the core insulating regions 15. The bit line metal layer 36*b* is provided between the core insulating regions 15 and the bit line semiconductor layer 36*a*. The bit line semiconductor layer 36*a* surrounds the bit line metal layer 36*b*.

The bit line semiconductor layer 36*a* is electrically connected to the channel semiconductor layer 30. For example, the bit line semiconductor layer 36*a* is in contact with the first channel semiconductor layer 30*a* and the second channel semiconductor layer 30*b*.

For example, the bit line semiconductor layer 36*a* is in contact with the channel semiconductor layer 30. For example, the bit line semiconductor layer 36*a* is in contact with the first channel semiconductor layer 30*a* and the second channel semiconductor layer 30*b*.

The bit line layer 36 has, for example, a wide-width portion and a narrow-width portion. For example, the wide-width portion and the narrow-width portion are alternately provided in the x direction.

For example, as illustrated in FIG. 4, the bit line layer 36 has a second wide-width portion W2 and a second narrow-width portion N2. The second wide-width portion W2 is an example of a third portion. The second narrow-width portion N2 is an example of a fourth portion.

The second wide-width portion W2 and the second narrow-width portion N2 are alternately provided in the x direction. The width in the y direction of the second wide-width portion W2 is larger than the width in the y direction of the second narrow-width portion N2.

The width in the y direction of the second wide-width portion W2 and the width in the y direction of the second narrow-width portion N2 each mean the distance of a line in the y direction that connects two points on the outer edge of the bit line layer 36. In other words, the width in the y direction of the second wide-width portion W2 and the width in the y direction of the second narrow-width portion N2 each mean the distance of a line in the y direction that connects two points on the boundary between the bit line layer 36 and the second interlayer insulating layer 14.

The bit line layer 36 is a conductor. The bit line semiconductor layer 36*a* contains a semiconductor. The bit line semiconductor layer 36*a* is, for example, an n-type semiconductor containing an n-type impurity. The bit line semiconductor layer 36*a* is, for example, n-type polycrystalline silicon.

The concentration of the n-type impurity in the bit line semiconductor layer 36*a* is higher than the concentration of the n-type impurity in the channel semiconductor layer 30.

The bit line metal layer 36*b* contains a metal. The bit line metal layer 36*b* is, for example, a metal. The bit line metal layer 36*b* is, for example, titanium nitride or tungsten.

The core insulating region 15 extends, for example, in the z direction. The bit line layer 36 surrounds the core insulating region 15. The core insulating region 15 is an example of an insulating region.

The core insulating region 15 is an insulator. The core insulating region 15 contains, for example, silicon oxide. The core insulating region 15 is, for example, silicon oxide.

The plate wiring layer 26 extends, for example, along the surface of the semiconductor substrate 10. The plate wiring layer 26 extends, for example, in the x direction.

The plate wiring layer 26 is electrically connected to a plurality of the plate electrode layers 22. The plate wiring layer 26 is electrically connected to the plate electrode layer 22, for example, using the first contact plug 38.

For example, as illustrated in FIG. 6, the first plate electrode layer 22*a* and the third plate electrode layer 22*c* are electrically connected to each other using one plate wiring layer 26. For example, the second plate electrode layer 22*b* and the fourth plate electrode layer 22*d* are electrically connected to each other using one plate wiring layer 26.

The plate wiring layer 26 corresponds to the global plate line GPL illustrated in FIG. 2.

The plate wiring layer 26 contains a metal. The plate wiring layer 26 is, for example, copper, titanium nitride, or tungsten.

The first contact plug 38 contains a metal. The first contact plug 38 is, for example, copper or tungsten.

The first wiring insulating layer 16 is provided between the capacitor connection line layer 20 and the plate wiring layer 26. For example, the first wiring insulating layer 16 has a function of electrically separating the capacitor connection line layer 20 from the plate wiring layer 26.

The first wiring insulating layer 16 contains an insulator. The first wiring insulating layer 16 is, for example, silicon oxide.

The gate wiring layer 34 extends, for example, along the surface of the semiconductor substrate 10. The gate wiring layer 34 extends, for example, in the y direction.

The gate wiring layer 34 is electrically connected to the gate electrode layer 28. The gate wiring layer 34 is electrically connected to the gate electrode layer 28, for example, using the second contact plug 40.

The gate wiring layer 34 corresponds to the global word line GWL illustrated in FIG. 2.

The gate wiring layer 34 contains a metal. The gate wiring layer 34 is, for example, copper, titanium nitride, or tungsten.

The second contact plug 40 contains a metal. The second contact plug 40 is, for example, copper or tungsten.

The second wiring insulating layer 18 is provided between the plate wiring layer 26 and the gate wiring layer 34. For example, the second wiring insulating layer 18 has a function of electrically separating the plate wiring layer 26 from the gate wiring layer 34.

The second wiring insulating layer 18 contains an insulator. The second wiring insulating layer 18 is, for example, silicon oxide.

Next, an example of a method for manufacturing a memory device of the first embodiment will be described.

FIGS. 10 to 27 are schematic cross-sectional views illustrating the method for manufacturing a memory device of the first embodiment. FIGS. 10 to 27 illustrate a cross section corresponding to FIG. 5.

On a silicon substrate 50, an aluminum oxide layer 52 is first formed. The aluminum oxide layer 52 is formed, for example, by chemical vapor deposition (CVD).

The silicon substrate 50 becomes the semiconductor substrate 10. The aluminum oxide layer 52 becomes the substrate insulating layer 12.

Figure 10:
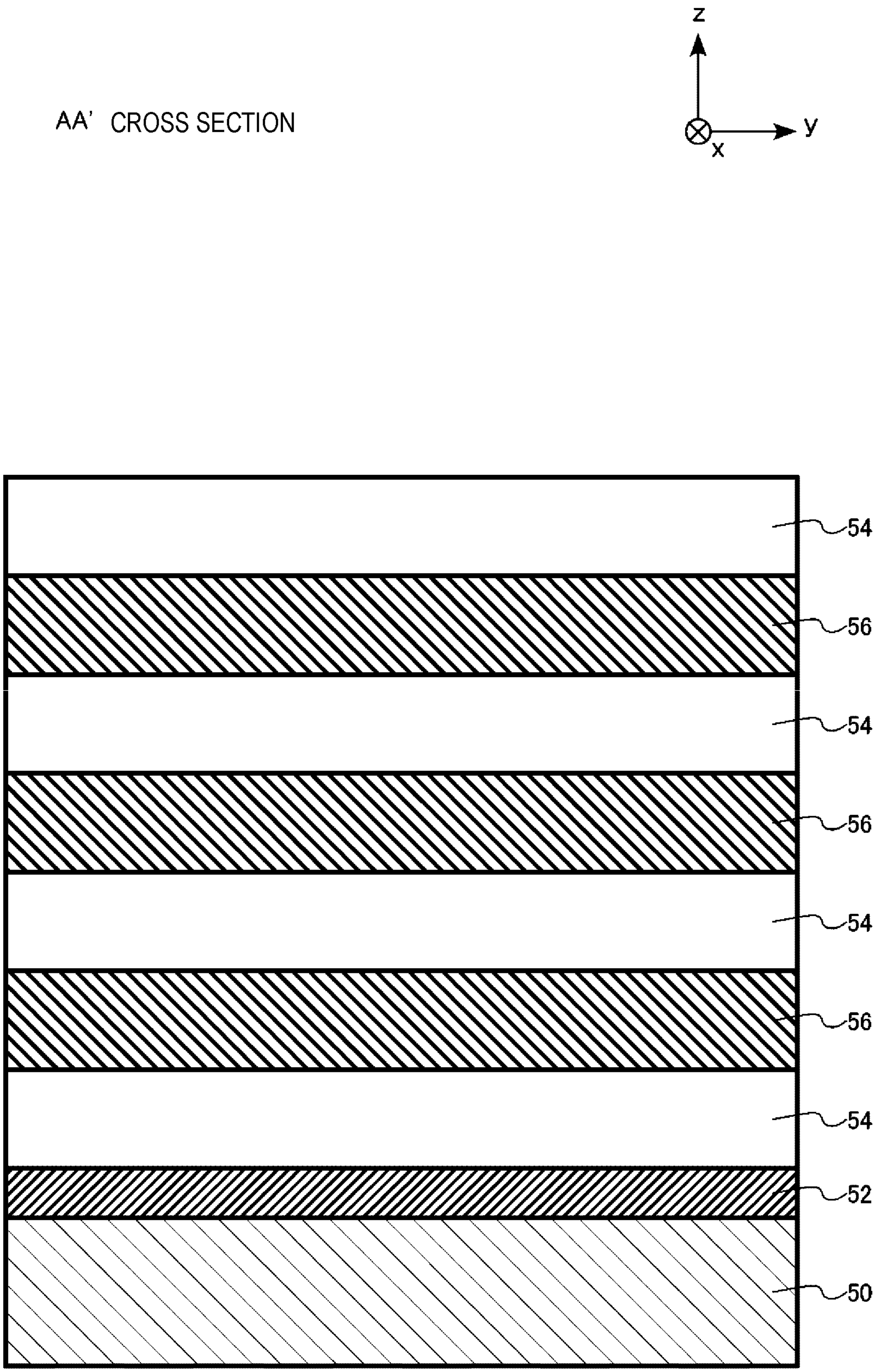
FIG. 10 is a schematic cross-sectional view illustrating a method for manufacturing a memory device of the first embodiment.

Next, a plurality of silicon oxide layers 54 and a plurality of silicon nitride layers 56 are alternately stacked on the aluminum oxide layer 52 (FIG. 10).

The silicon oxide layers 54 and the silicon nitride layers 56 are formed, for example, by CVD.

Finally, some of the silicon oxide layers 54 become the first interlayer insulating layer 13. Finally, some of the silicon nitride layers 56 become the second interlayer insulating layer 14.

Figure 11:
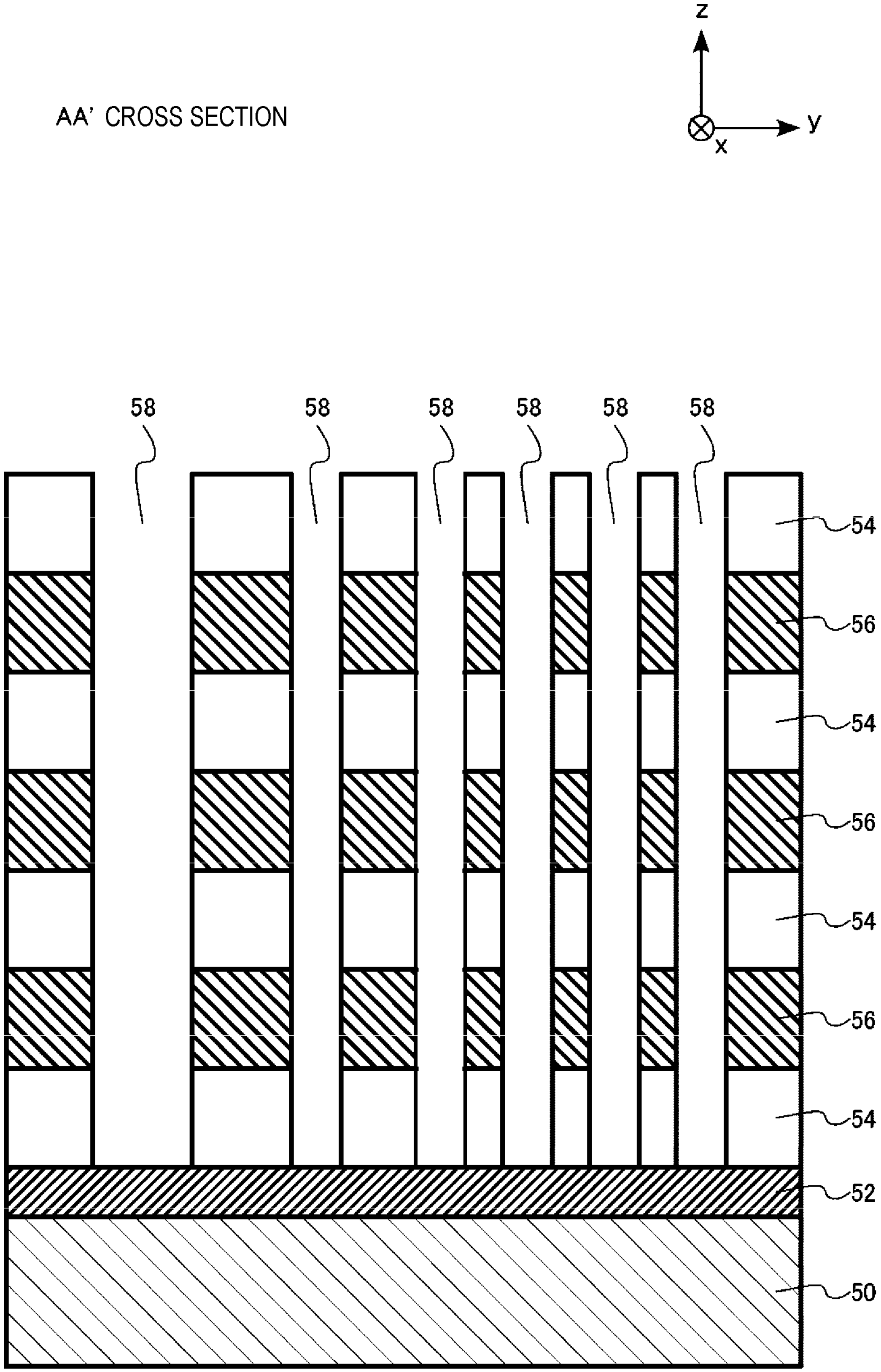
FIG. 11 is a schematic cross-sectional view illustrating the method for manufacturing a memory device of the first embodiment.

Next, an opening 58 that penetrates the silicon oxide layers 54 and the silicon nitride layers 56 is formed (FIG. 11). The aluminum oxide layer 52 is exposed to the bottom of the opening 58.

The opening 58 is formed, for example, by lithography and reactive ion etching (RIE). The opening 58 extends in the z direction.

Figure 12:
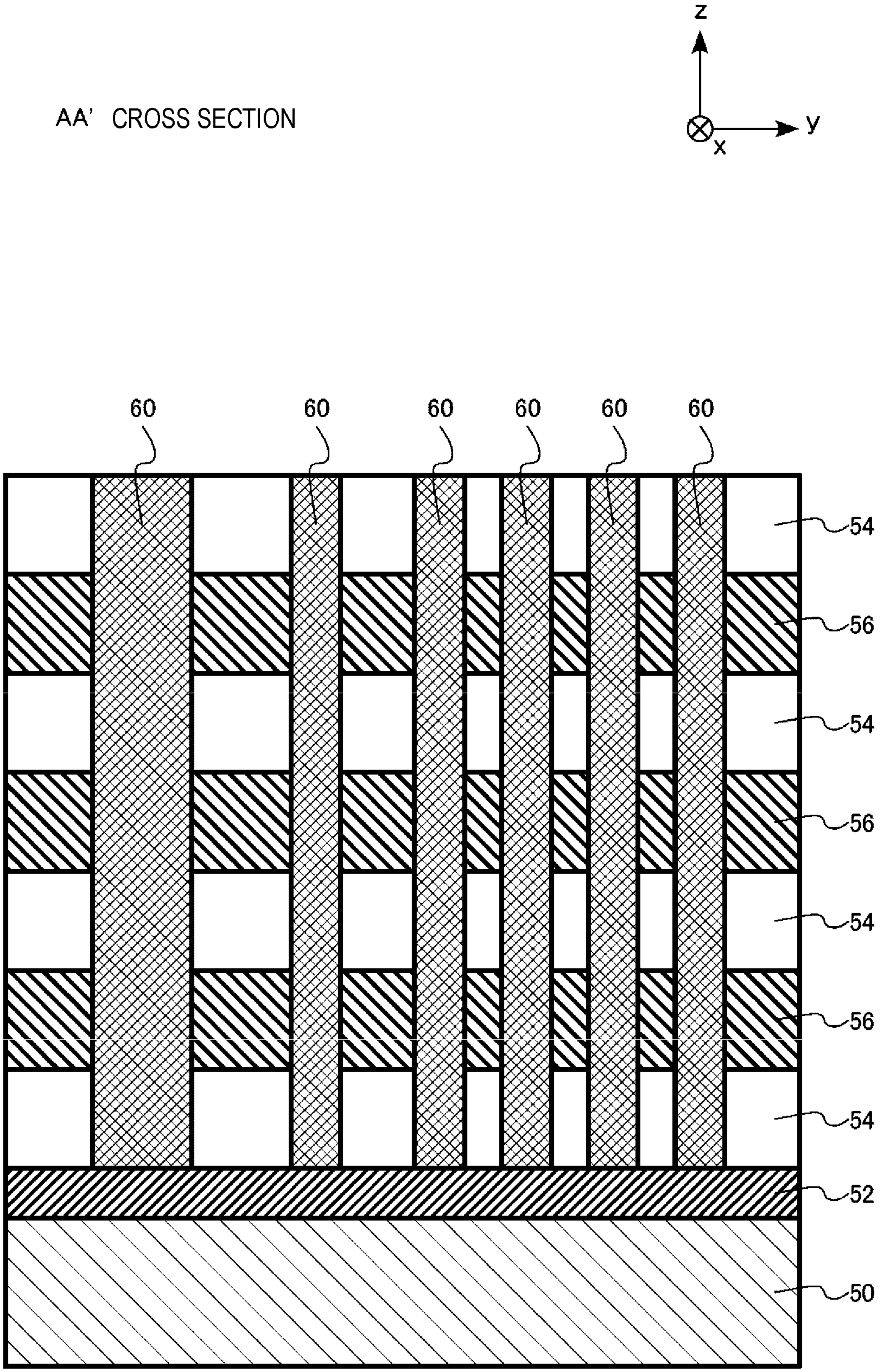
FIG. 12 is a schematic cross-sectional view illustrating the method for manufacturing a memory device of the first embodiment.

Next, the opening 58 is filled with a first polycrystalline silicon film 60 (FIG. 12). The first polycrystalline silicon film 60 is formed, for example, by CVD.

Figure 13:
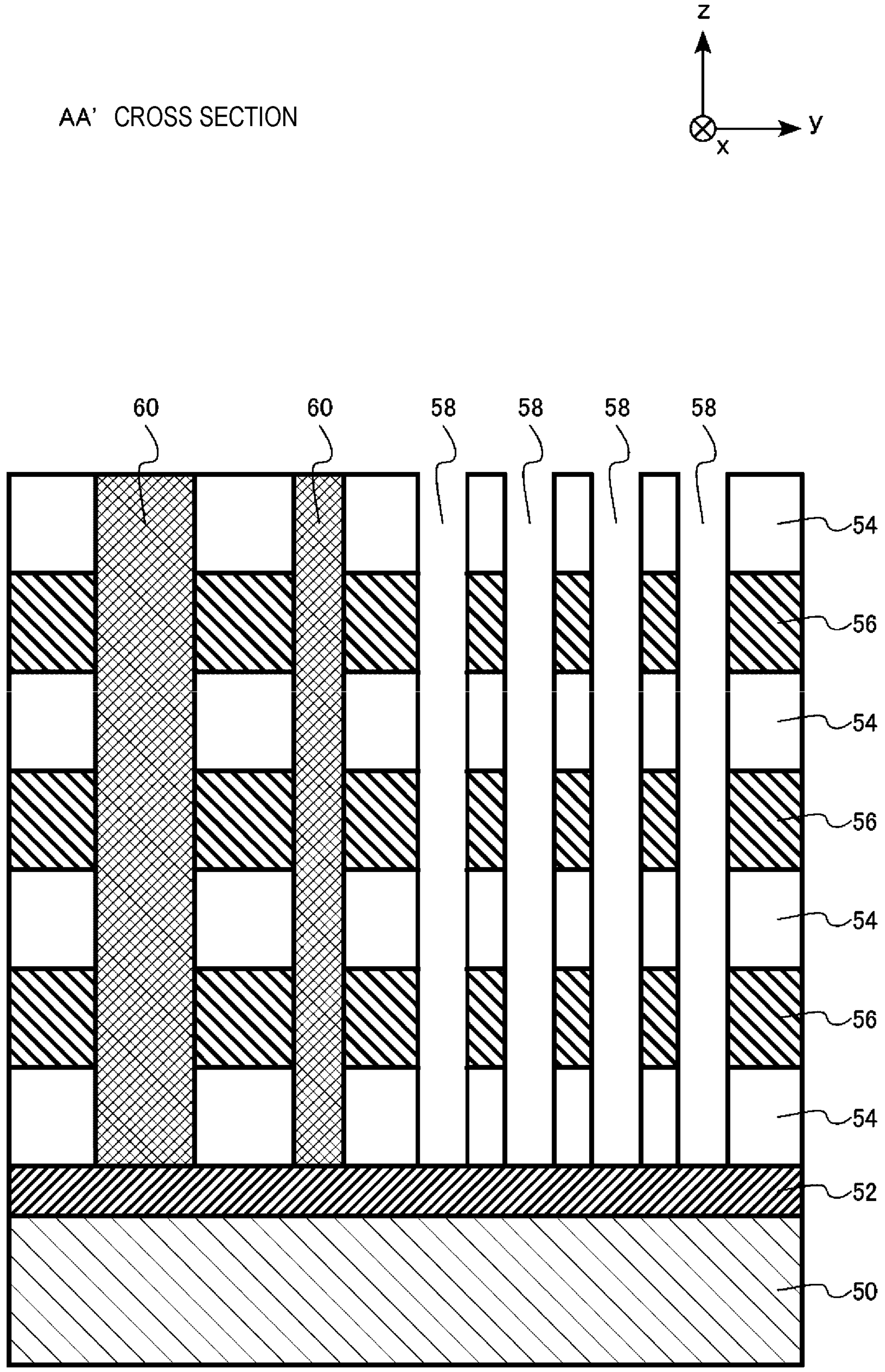
FIG. 13 is a schematic cross-sectional view illustrating the method for manufacturing a memory device of the first embodiment.

Next, the first polycrystalline silicon film 60 is removed from a portion of the opening 58 (FIG. 13). The first polycrystalline silicon film 60 is removed, for example, by wet etching.

Figure 14:
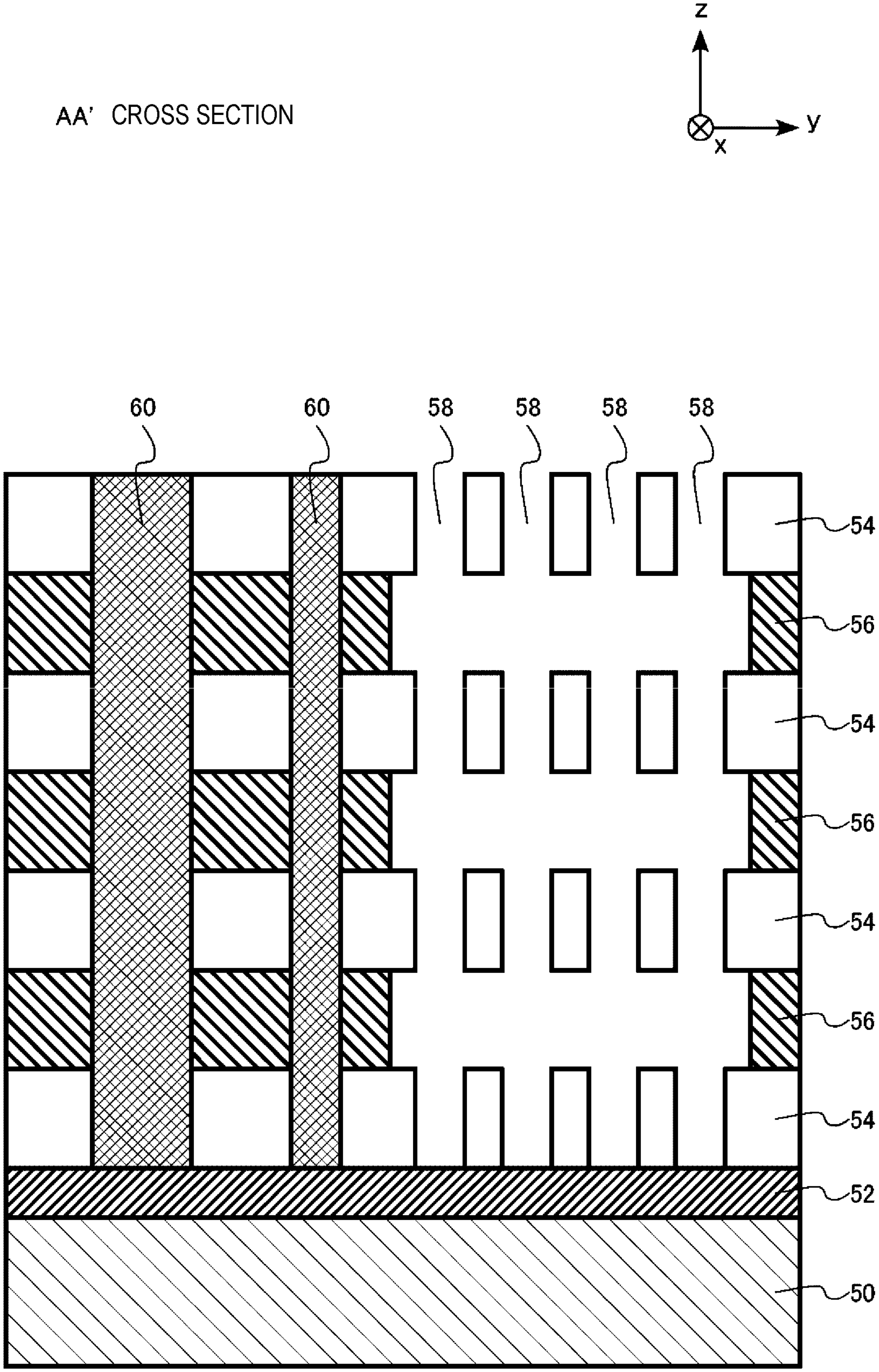
FIG. 14 is a schematic cross-sectional view illustrating the method for manufacturing a memory device of the first embodiment.

Next, the silicon nitride layers 56 are laterally etched from the side face of the opening 58 (FIG. 14). The silicon nitride layers 56 are etched, for example, by wet etching.

Figure 15:
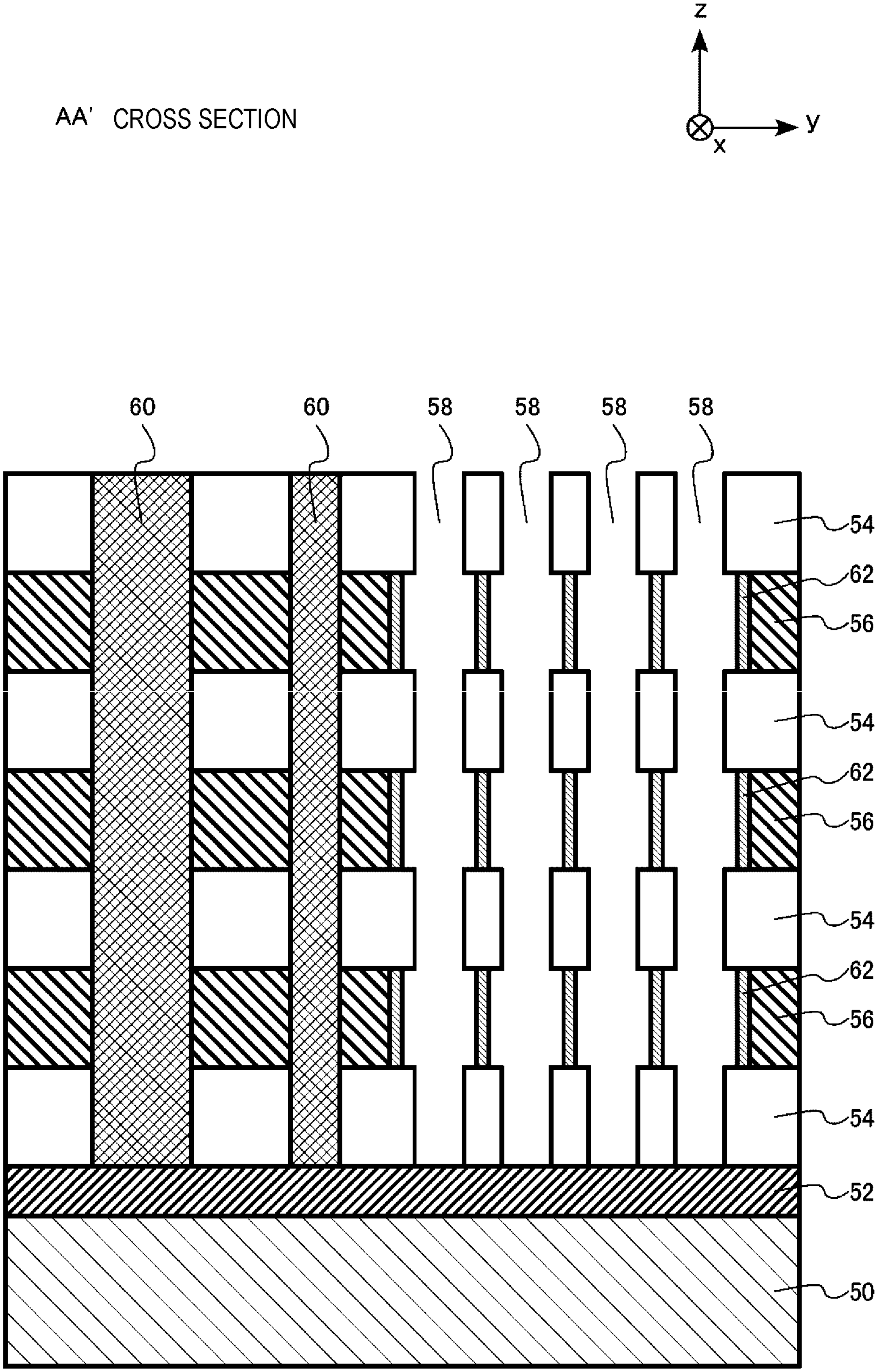
FIG. 15 is a schematic cross-sectional view illustrating the method for manufacturing a memory device of the first embodiment.

A first titanium nitride layer 62 is then formed on the side face of the opening 58 (FIG. 15). The first titanium nitride layer 62 is formed, for example, by accumulating a titanium nitride film by CVD and etching it by RIE. The first titanium nitride layer 62 becomes the capacitor connection line layer 20.

Figure 16:
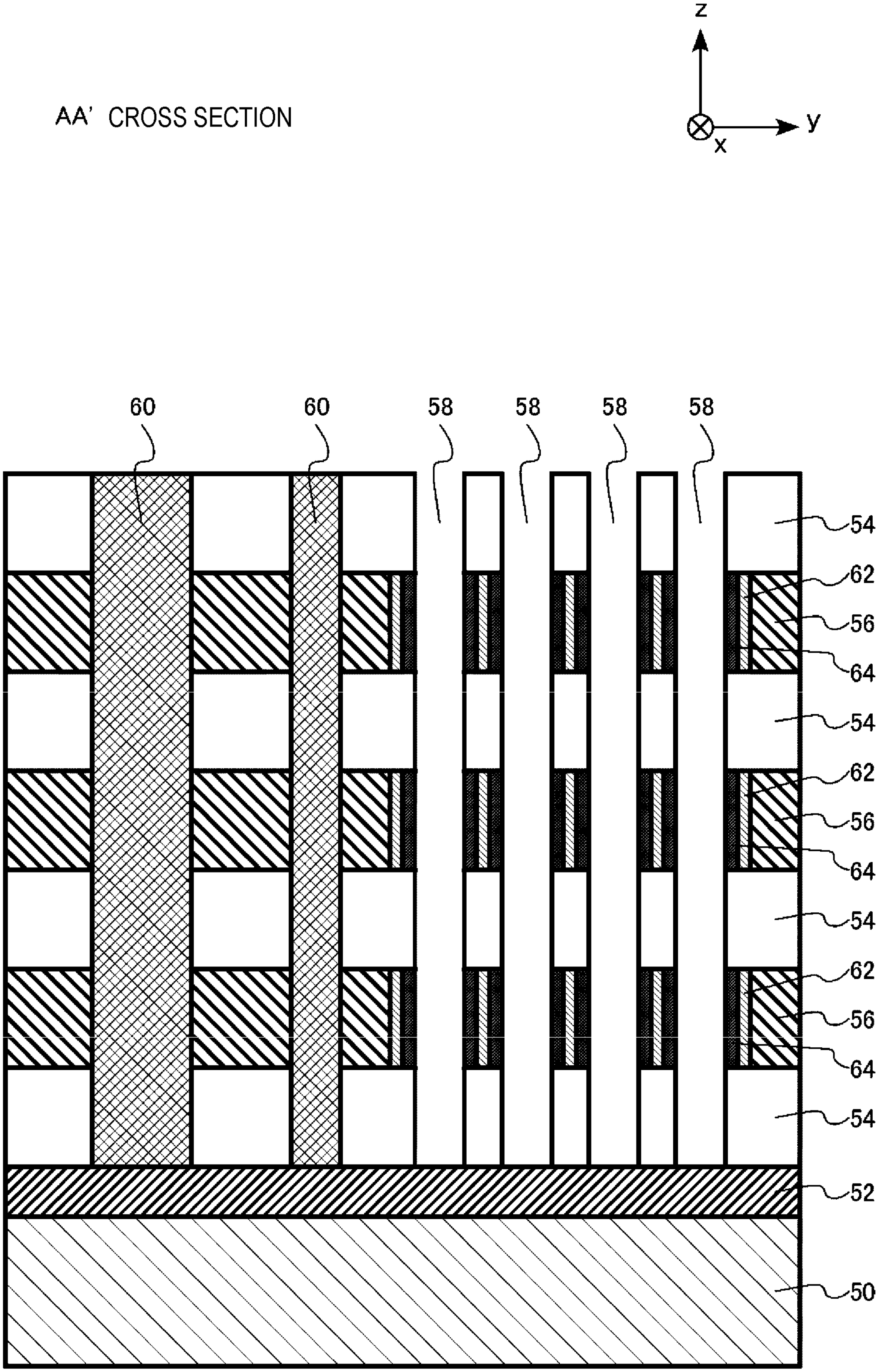
FIG. 16 is a schematic cross-sectional view illustrating the method for manufacturing a memory device of the first embodiment.

Next, a hafnium oxide layer 64 that is a ferroelectric is formed on the side face of the opening 58 (FIG. 16). The hafnium oxide layer 64 is formed, for example, by accumulating a hafnium oxide layer by CVD and etching it by RIE. The hafnium oxide layer 64 becomes the capacitor insulating layer 24.

Figure 17:
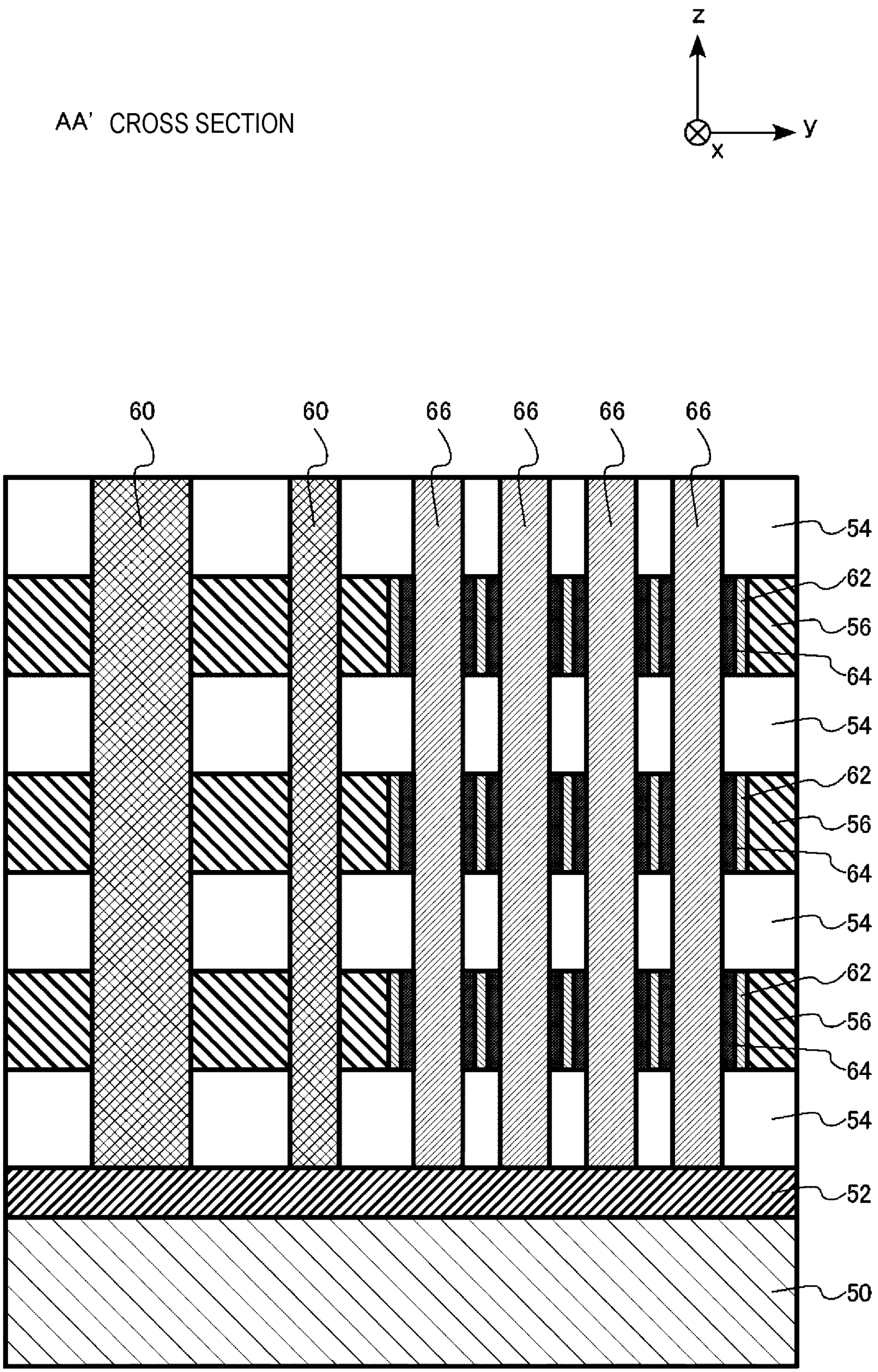
FIG. 17 is a schematic cross-sectional view illustrating the method for manufacturing a memory device of the first embodiment.

The opening 58 is then filled with a second titanium nitride layer 66 (FIG. 17). The second titanium nitride layer 66 is formed, for example, by CVD. The second titanium nitride layer 66 becomes the plate electrode layer 22.

Figure 18:
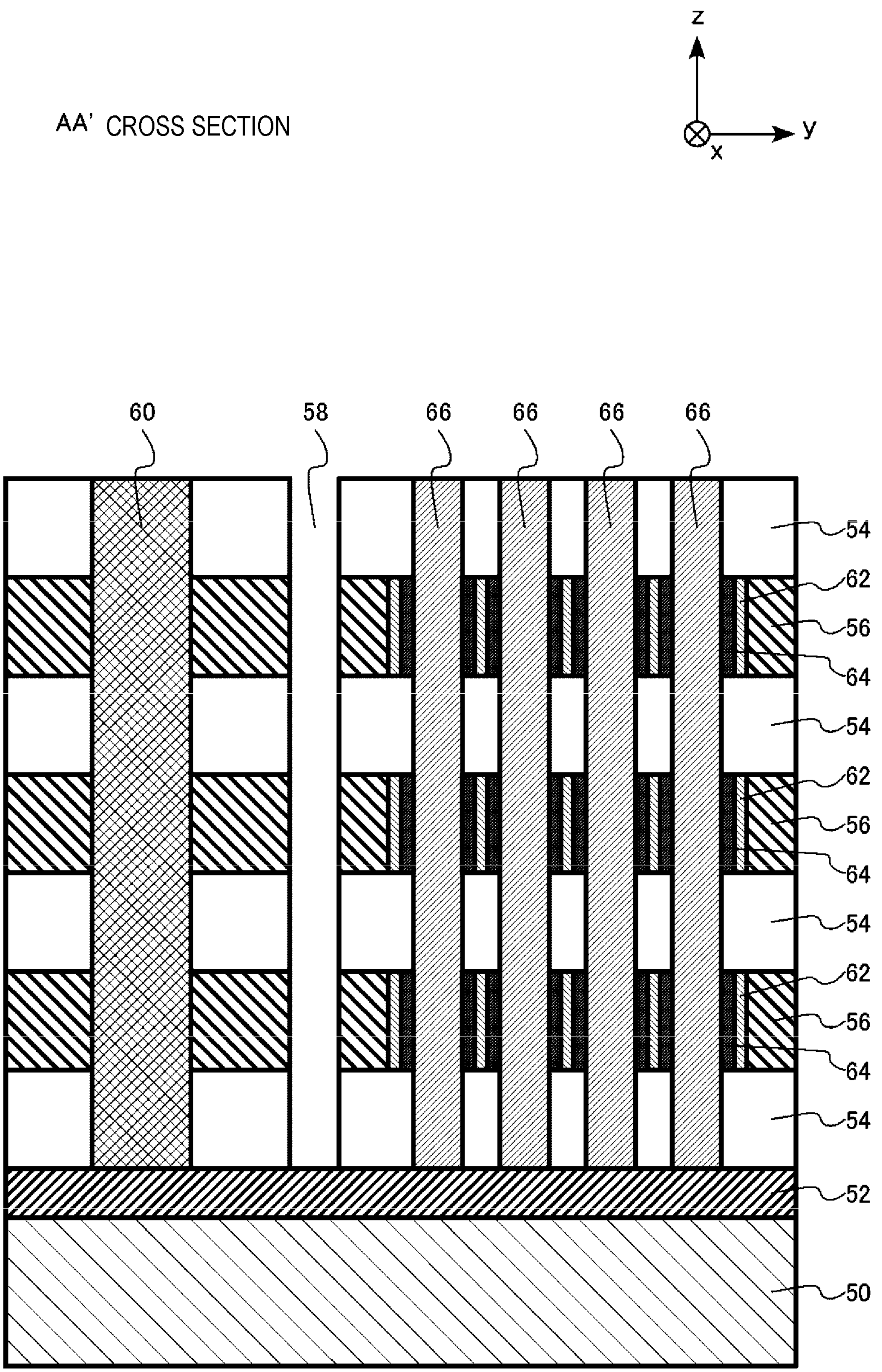
FIG. 18 is a schematic cross-sectional view illustrating the method for manufacturing a memory device of the first embodiment.

Next, the first polycrystalline silicon film 60 is removed from a portion of the opening 58 (FIG. 18). The first polycrystalline silicon film 60 is removed, for example, by wet etching.

Figure 19:
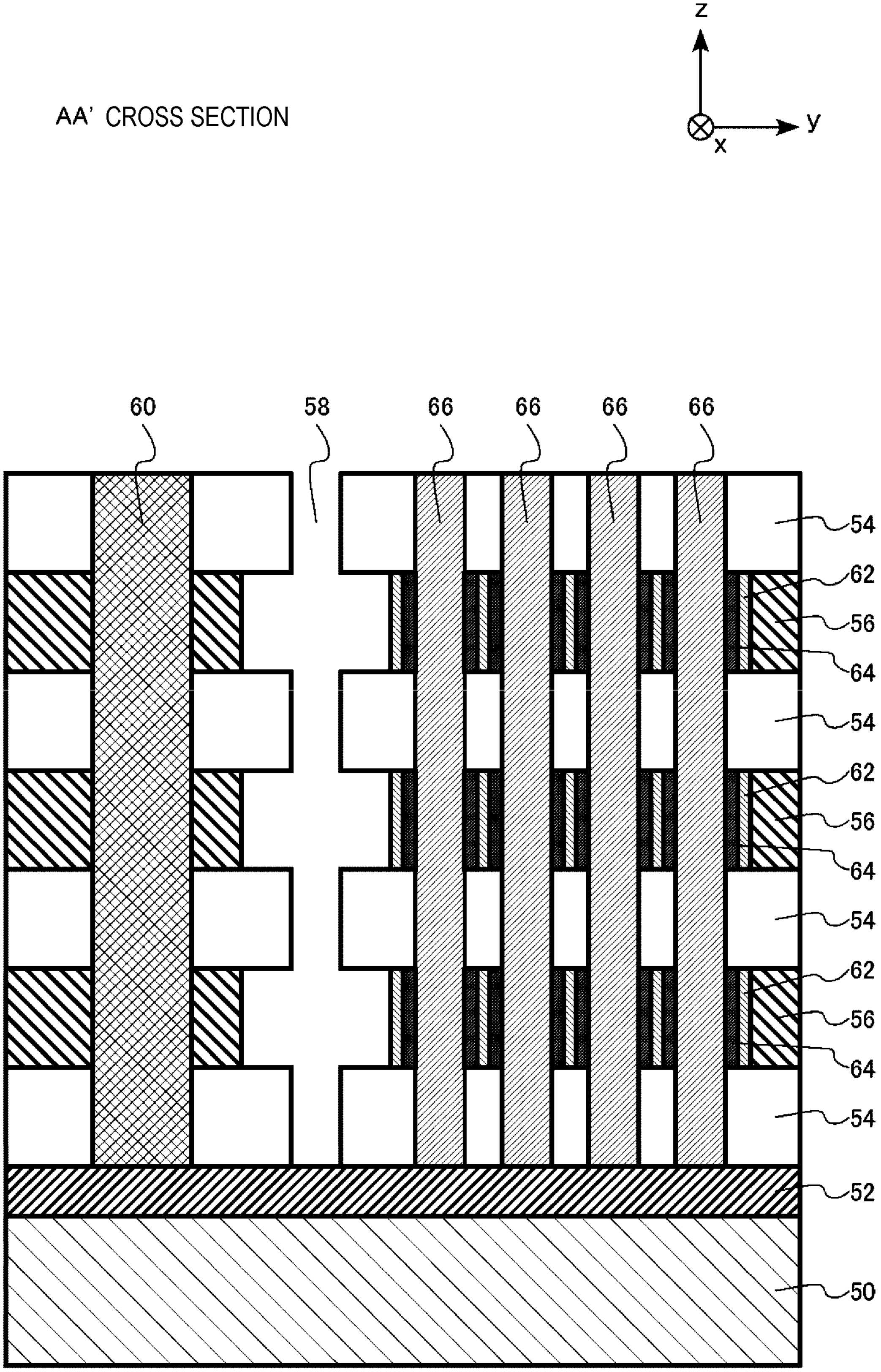
FIG. 19 is a schematic cross-sectional view illustrating the method for manufacturing a memory device of the first embodiment.

Next, the silicon nitride layers 56 are laterally etched from the side face of the opening 58 (FIG. 19). The first titanium nitride layer 62 is exposed to the side face of the opening 58. The silicon nitride layers 56 are etched, for example, by wet etching.

Figure 20:
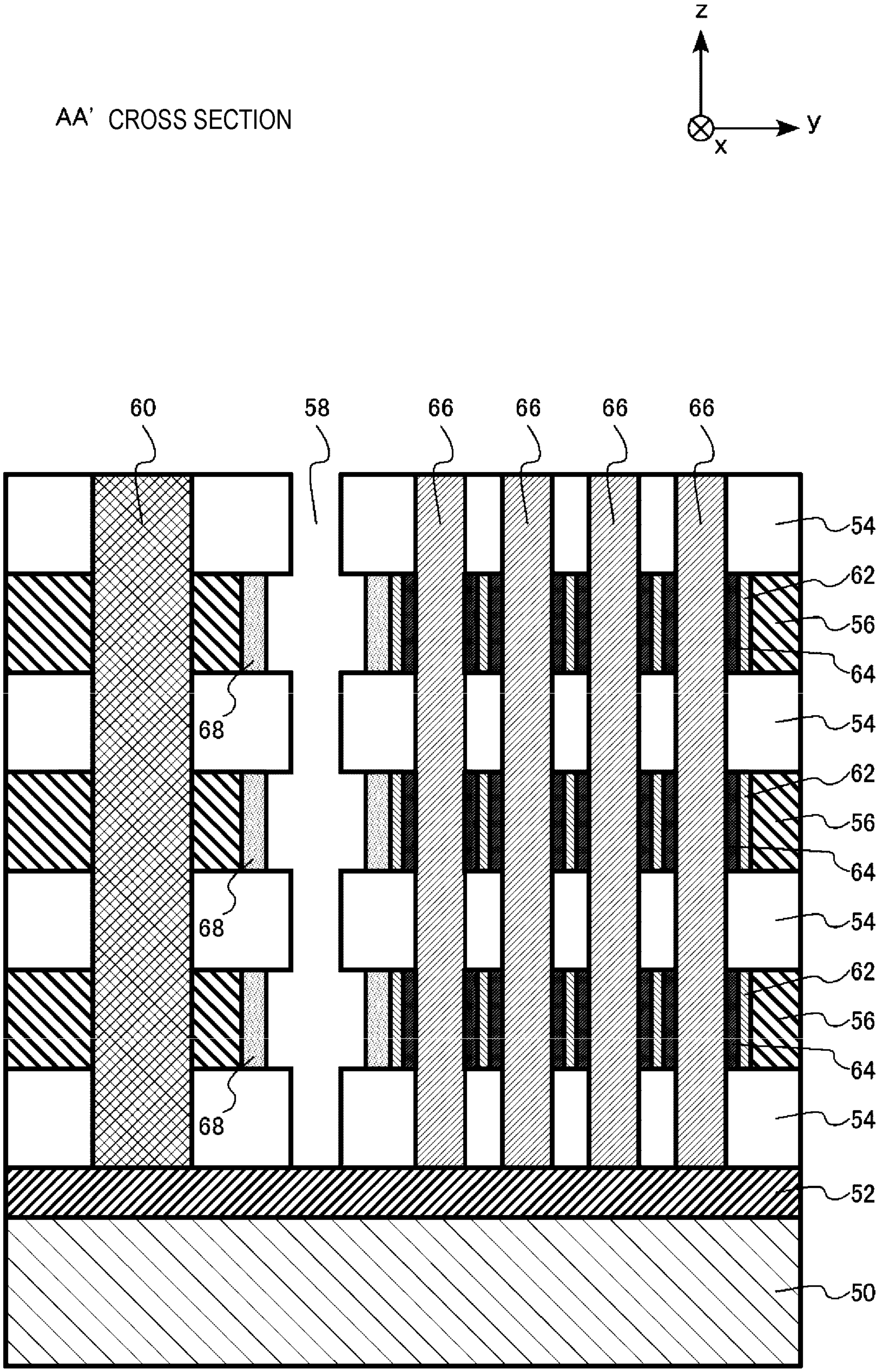
FIG. 20 is a schematic cross-sectional view illustrating the method for manufacturing a memory device of the first embodiment.

Next, a second polycrystalline silicon layer 68 is formed on the side face of the opening 58 (FIG. 20). The second polycrystalline silicon layer 68 is formed, for example, by accumulating a polycrystalline silicon film by CVD and etching it by RIE. The second polycrystalline silicon layer 68 becomes the channel semiconductor layer 30.

Figure 21:
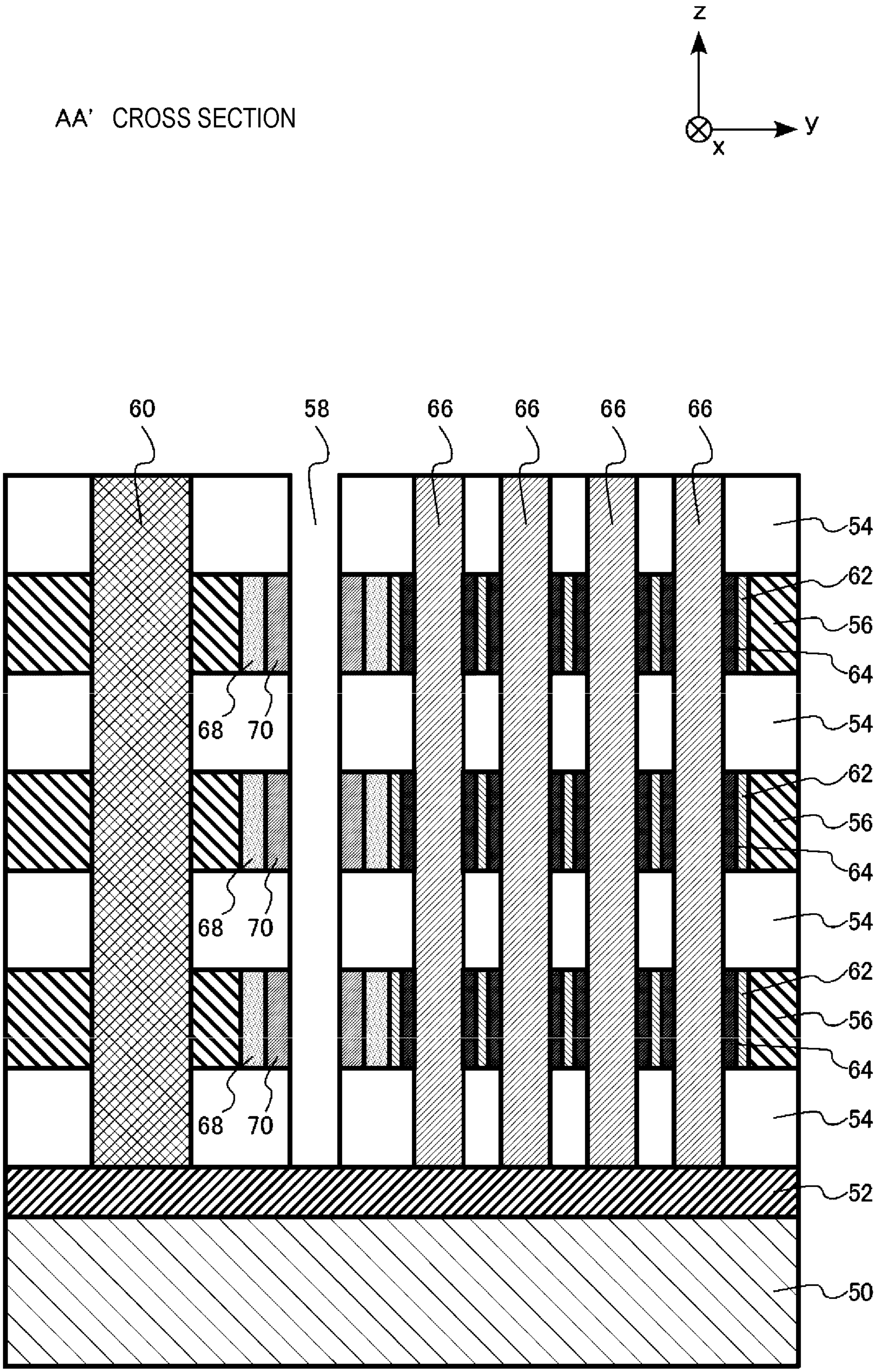
FIG. 21 is a schematic cross-sectional view illustrating the method for manufacturing a memory device of the first embodiment.

Next, a stacked insulating layer 70 is formed on the side face of the opening 58 (FIG. 21). The stacked insulating layer 70 has a stacked structure of silicon oxide, silicon nitride, and silicon oxide. The stacked insulating layer 70 is formed, for example, by accumulating a silicon oxide film, a silicon nitride film, and a silicon oxide film by CVD and etching them by RIE. The stacked insulating layer 70 becomes the gate insulating layer 32.

Figure 22:
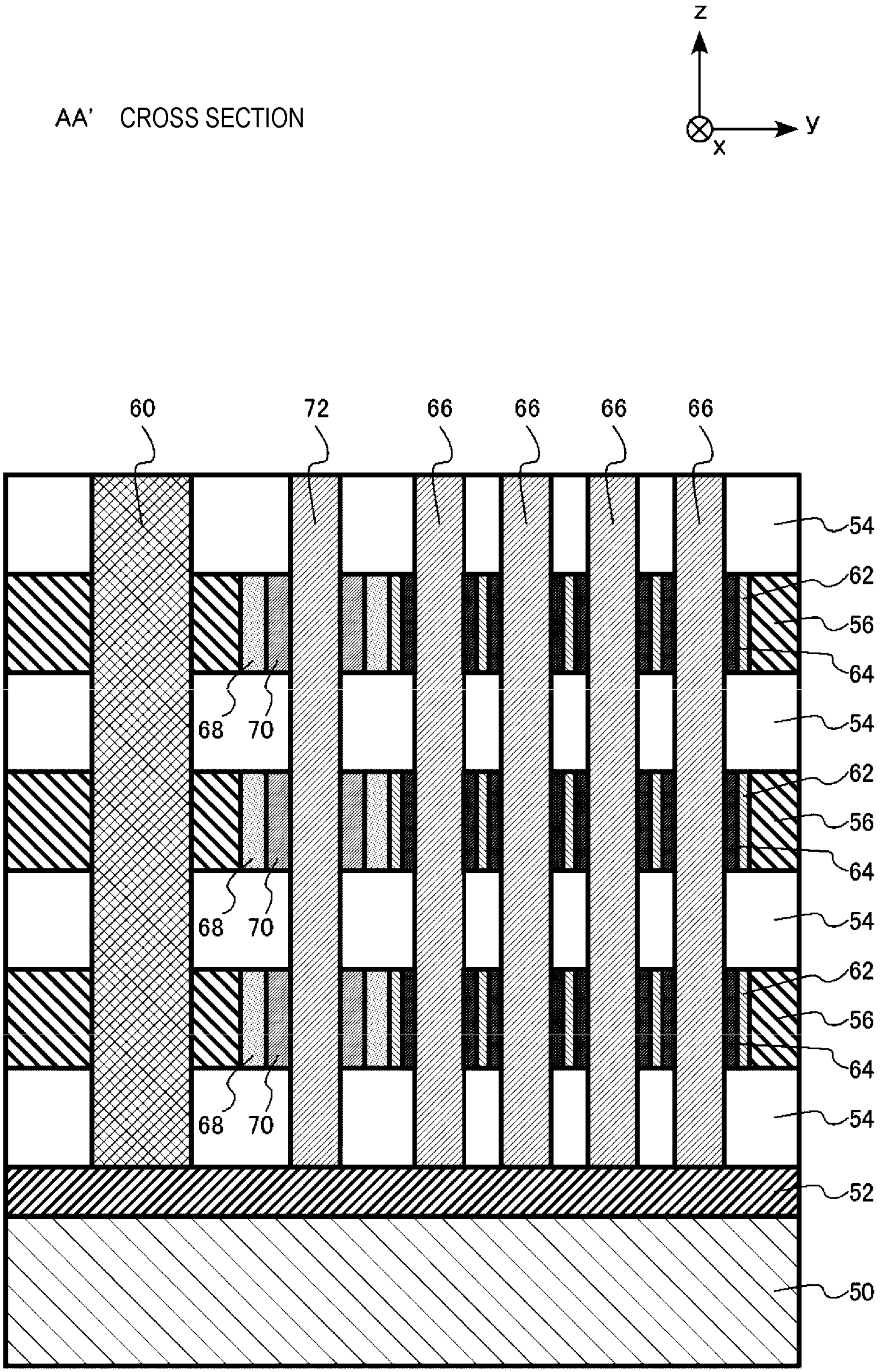
FIG. 22 is a schematic cross-sectional view illustrating the method for manufacturing a memory device of the first embodiment.

The opening 58 is then filled with a third titanium nitride layer 72 (FIG. 22). The third titanium nitride layer 72 is formed, for example, by CVD. The third titanium nitride layer 72 becomes the gate electrode layer 28.

Figure 23:
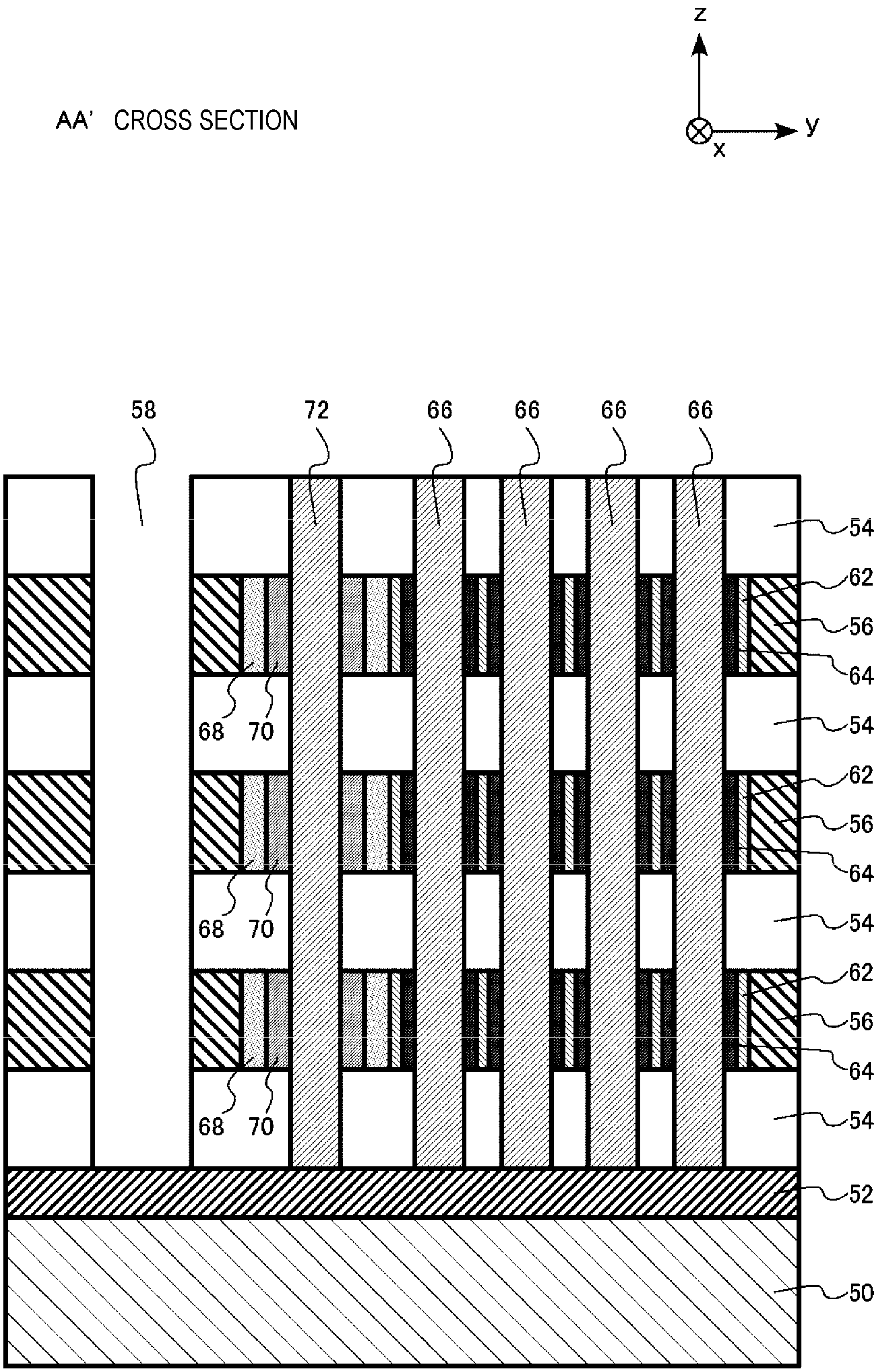
FIG. 23 is a schematic cross-sectional view illustrating the method for manufacturing a memory device of the first embodiment.

Next, the first polycrystalline silicon film 60 is removed from a portion of the opening 58 (FIG. 23). The first polycrystalline silicon film 60 is removed, for example, by wet etching.

Figure 24:
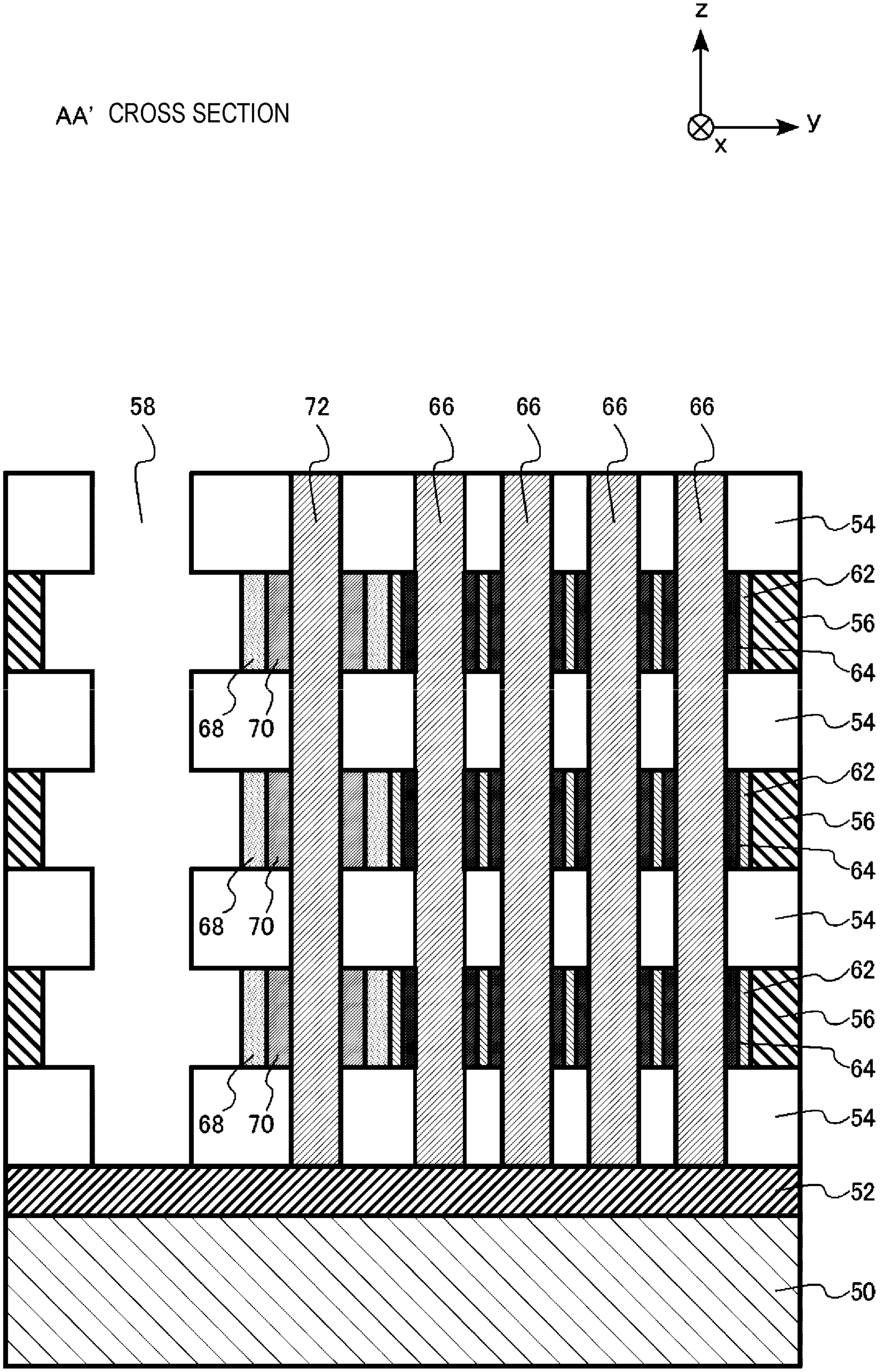
FIG. 24 is a schematic cross-sectional view illustrating the method for manufacturing a memory device of the first embodiment.

Next, the silicon nitride layers 56 are laterally etched from the side face of the opening 58 (FIG. 24). The second polycrystalline silicon layer 68 is exposed to the side face of the opening 58. The silicon nitride layers 56 are etched, for example, by wet etching.

Figure 25:
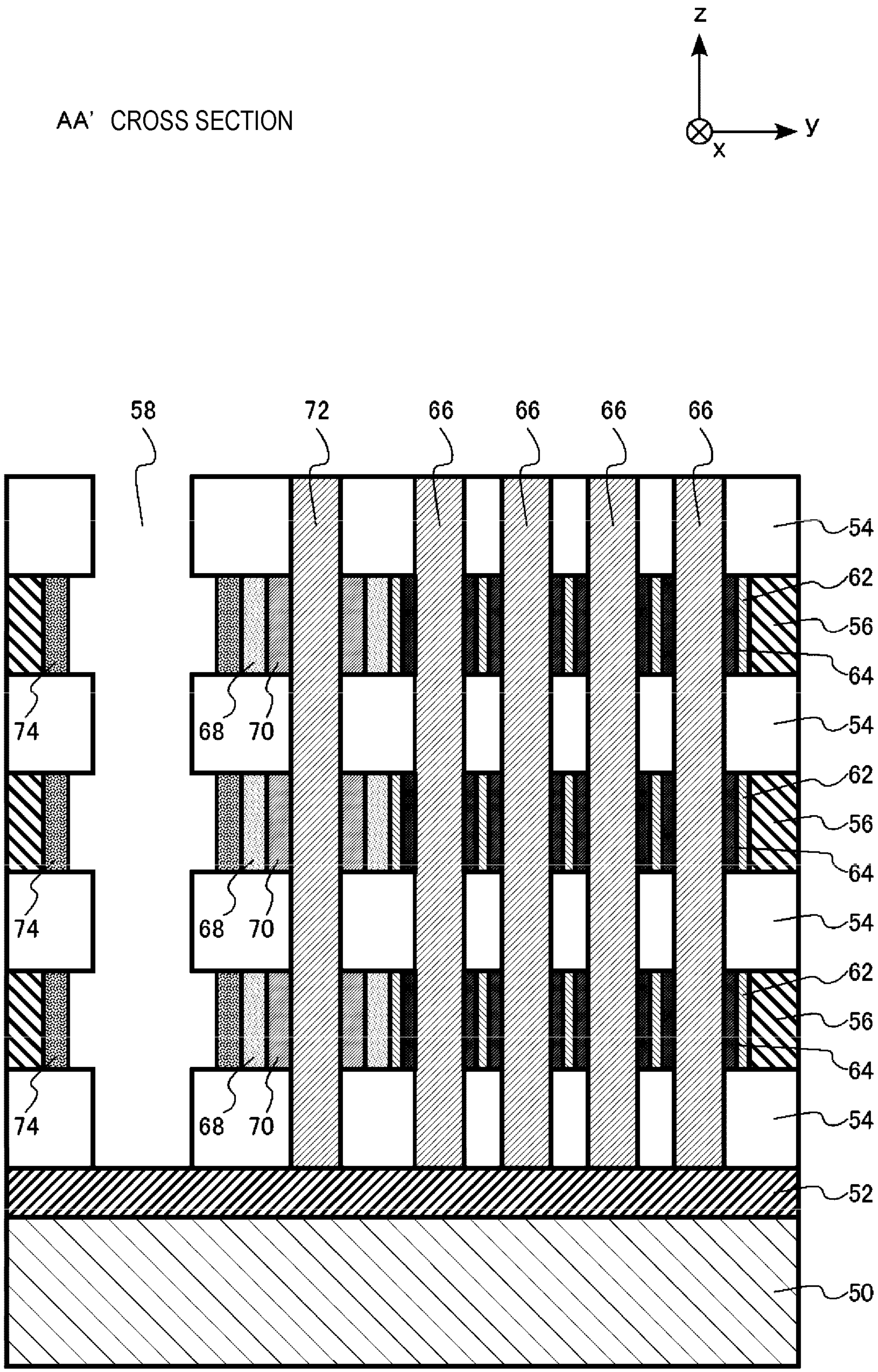
FIG. 25 is a schematic cross-sectional view illustrating the method for manufacturing a memory device of the first embodiment.

Next, a third n-type polycrystalline silicon layer 74 containing an n-type impurity is formed on the side face of the opening 58 (FIG. 25). The third polycrystalline silicon layer 74 is formed, for example, by accumulating a polycrystalline silicon film by CVD and etching it by RIE. The third polycrystalline silicon layer 74 becomes the bit line semiconductor layer 36*a*.

Figure 26:
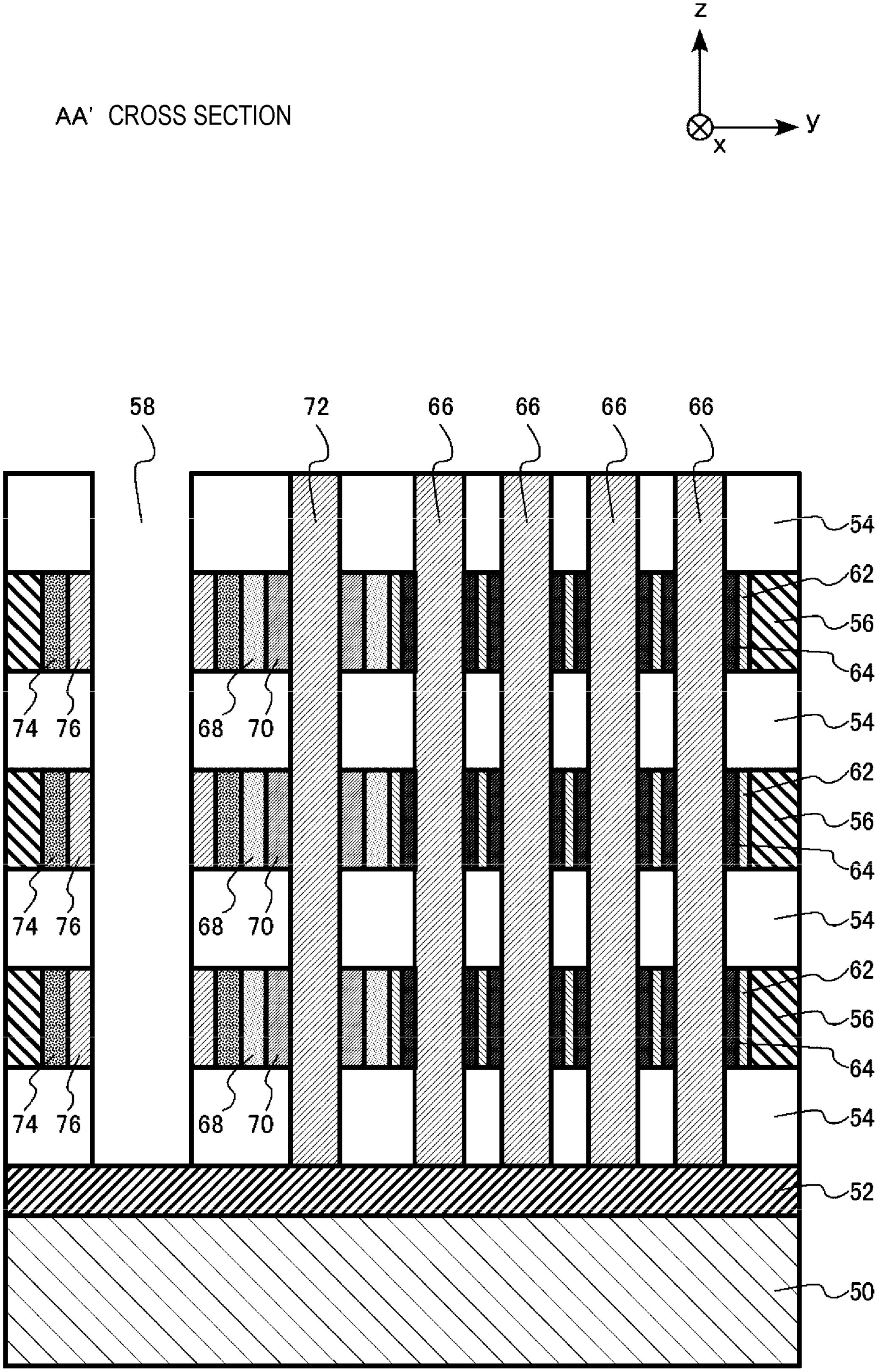
FIG. 26 is a schematic cross-sectional view illustrating the method for manufacturing a memory device of the first embodiment.

A fourth titanium nitride layer 76 is formed on the side face of the opening 58 (FIG. 26). The fourth titanium nitride layer 76 is formed, for example, by accumulating a titanium nitride film by CVD and etching it by RIE. The fourth titanium nitride layer 76 becomes the bit line metal layer 36*b*.

Figure 27:
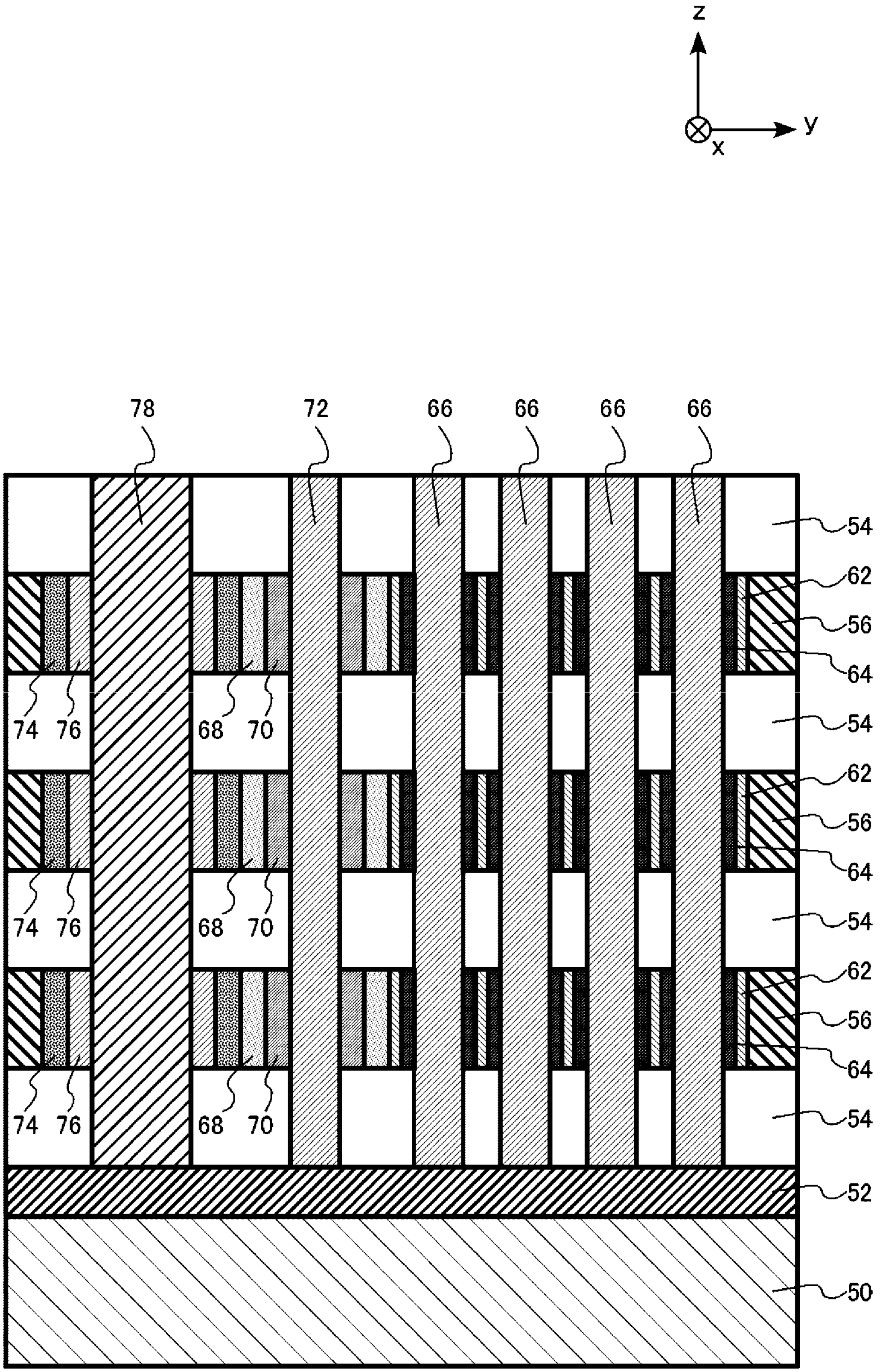
FIG. 27 is a schematic cross-sectional view illustrating the method for manufacturing a memory device of the first embodiment.

Next, the opening 58 is filled with a silicon oxide film 78 (FIG. 27). The silicon oxide film 78 is formed, for example, by CVD. The silicon oxide film 78 becomes the core insulating region 15.

Subsequently, the first wiring insulating layer 16, the first contact plug 38, the plate wiring layer 26, the second wiring insulating layer 18, the second contact plug 40, and the gate wiring layer 34 are formed by a publicly known manufacturing method.

By the manufacturing method described above, the memory cell array 101 in the three-dimensional ferroelectric memory 100 of the first embodiment is manufactured.

Next, actions and effects of the memory device of the first embodiment will be described.

The three-dimensional ferroelectric memory 100 of the first embodiment uses a ferroelectric for the capacitor insulating layer in the cell capacitors CC. For example, the three-dimensional ferroelectric memory 100 can increase the speed of reading operation by using a short reversal time of the ferroelectric.

In the three-dimensional ferroelectric memory 100, the cell capacitors CC have a structure of a metal, an insulator, and a metal. Therefore, endurance is improved, for example, as compared with a cell capacitor having a structure of a semiconductor, an insulator, and a metal. Accordingly, a ferroelectric memory having high reliability can be achieved.

In the memory cell array 101 in the three-dimensional ferroelectric memory 100, the cell capacitors CC are three-dimensionally arranged, and thus a high degree of integration and low cost are achieved.

In the three-dimensional ferroelectric memory 100, for example, the openings 58 can be formed in a batch process and the plate electrode layer 22, the capacitor connection line layer 20, the gate electrode layer 28, and the bit line layer 36 are formed in a self-alignment manner. This enables to achieve finer structures and higher integration of the memory cell array 101.

The gate insulating layer 32 of the select transistor ST in the three-dimensional ferroelectric memory 100 has the charge storage region 32*y* capable of storing charges. Therefore, the threshold voltage of the select transistor ST can be adjusted. Thus, the speed of reading operation can be increased.

According to the first embodiment, the memory device capable of being operated at high speed can be achieved.

Second Embodiment

A memory device of a second embodiment is different from the memory device of the first embodiment in that the first gate insulating layer does not have a charge storage region. A description of parts of the second embodiment that is the same as those of the first embodiment will be omitted below.

Figure 28:
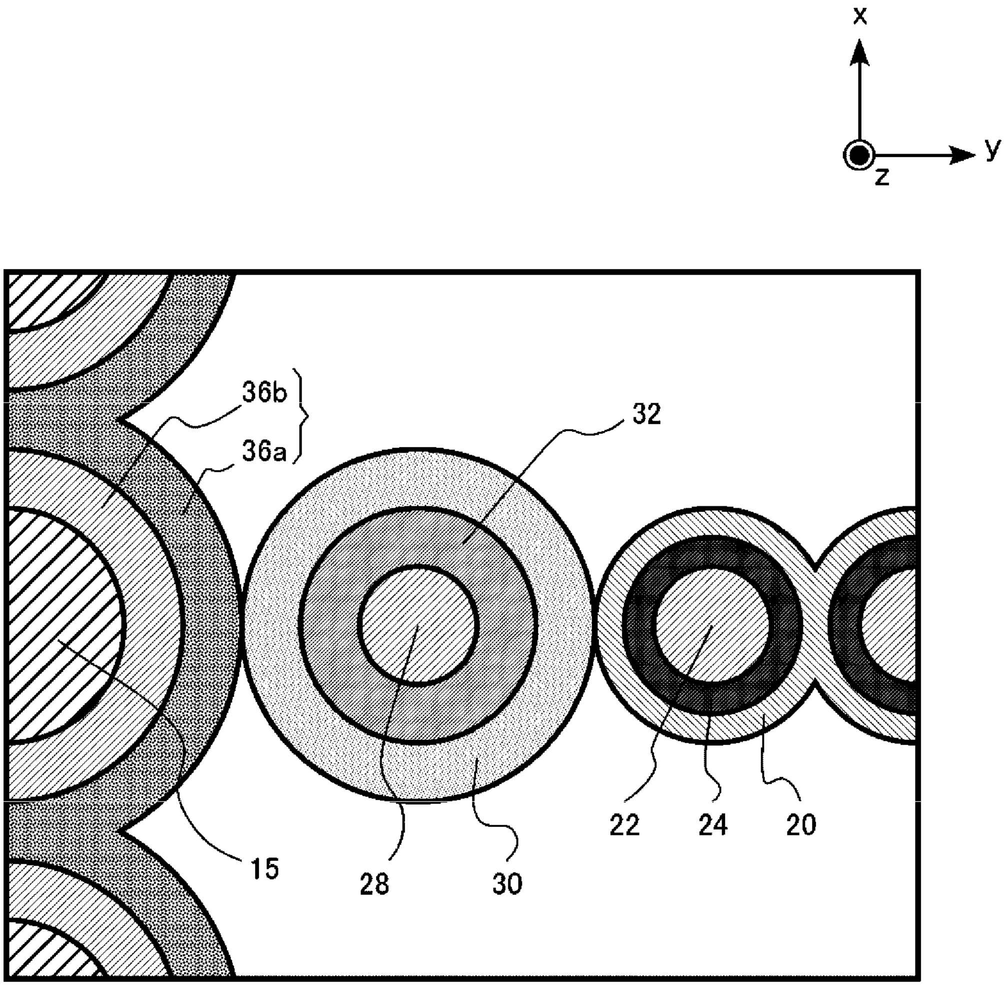
FIG. 28 is a schematic enlarged cross-sectional view of a portion of a memory device of a second embodiment.

FIG. 28 is a schematic enlarged cross-sectional view of a portion of the memory device of the second embodiment. FIG. 28 is a view corresponding to FIG. 9 of the first embodiment.

The gate insulating layer 32 does not have a charge storage region and has a single-layer structure. The gate insulating layer 32 is, for example, a silicon oxide layer.

According to the second embodiment, the memory device capable of being operated at high speed can be achieved.

Third Embodiment

A memory device of a third embodiment is different from the memory device of the first embodiment in that the patterns of the first and second electrode layers and the pattern of the wiring layer are different. A description of parts of the second embodiment that is the same as those of the first embodiment will be omitted below.

Figure 29:
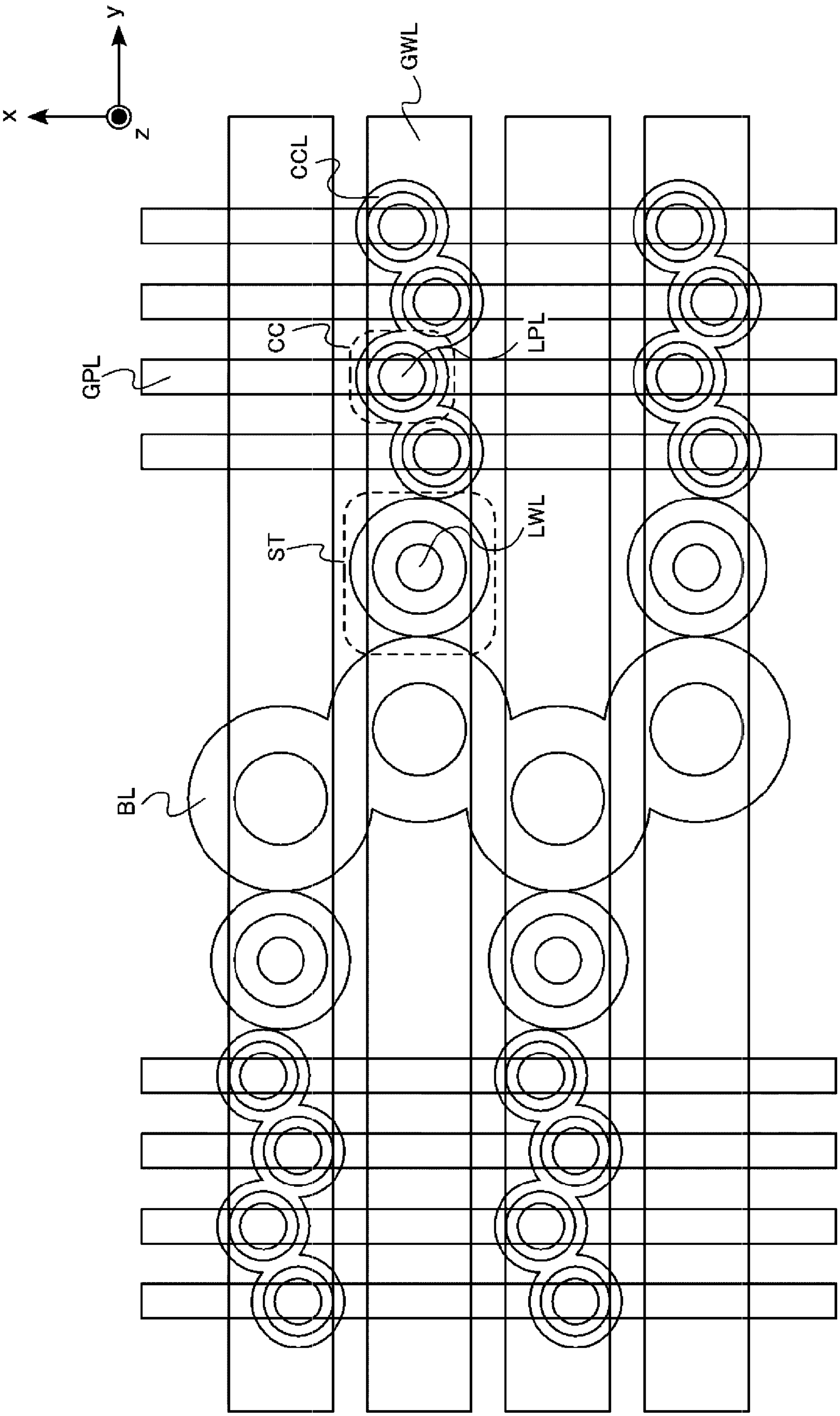
FIG. 29 is a pattern layout of a memory cell array in a memory device of a third embodiment.

FIG. 29 is a pattern layout of a memory cell array in the memory device of the third embodiment. FIG. 29 is a view corresponding to FIG. 3 of the first embodiment. FIG. 29 illustrates a cross section that is perpendicular to the z direction.

As illustrated in FIG. 29, a local plate line LPL is disposed zigzag in the y direction, and a capacitor connection line CCL extends zigzag in the y direction. A bit line BL extends zigzag in the x direction.

For example, use of the pattern layout as illustrated in FIG. 29 can achieve further finer structures and higher integration of the memory cell array.

According to the third embodiment, the memory device capable of being operated at high speed can be achieved.

In the embodiments, a case where a substrate is a semiconductor substrate is described as an example, but the substrate may be an insulating substrate. In another embodiment, the substrate may not be provided.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory device comprising:
- a substrate;
- a first electrode layer extending in a first direction that intersects a surface of the substrate;
- a second electrode layer extending in the first direction;
- a first conductive layer surrounding the first electrode layer and the second electrode layer;
- a first insulating layer provided between the first electrode layer and the first conductive layer, surrounding the first electrode layer, and including oxygen (O) and at least one of hafnium (Hf) or zirconium (Zr);
- a second insulating layer provided between the second electrode layer and the first conductive layer, surrounding the second electrode layer, and including oxygen (O) and at least one of hafnium (Hf) or zirconium (Zr);
- a first gate electrode layer extending in the first direction;
- a first semiconductor layer surrounding the first gate electrode layer and electrically connected to the first conductive layer; and
- a first gate insulating layer provided between the first gate electrode layer and the first semiconductor layer and surrounding the first gate electrode layer.

2. The memory device according to claim 1, wherein the first conductive layer contains a metal.

3. The memory device according to claim 1, wherein the first electrode layer is provided between the first gate electrode layer and the second electrode layer.

4. The memory device according to claim 1, wherein the first insulating layer and the second insulating layer each contain a ferroelectric.

5. The memory device according to claim 1, wherein the first insulating layer and the second insulating layer each contain an orthorhombic or trigonal crystal.

6. The memory device according to claim 1, wherein the first insulating layer and the second insulating layer each contain at least one element selected from the group consisting of silicon (Si), aluminum (Al), titanium (Ti), vanadium (V), niobium (Nb), tantalum (Ta), strontium (Sr), scandium (Sc), yttrium (Y), lanthanum (La), samarium (Sm), gadolinium (Gd), terbium (Tb), dysprosium (Dy), holmium (Ho), erbium (Er), ytterbium (Yb), lutetium (Lu), and barium (Ba).

7. The memory device according to claim 1, wherein the first gate insulating layer has a charge storage region configured to store charges.

8. The memory device according to claim 1, further comprising:
- a third electrode layer extending in the first direction;
- a fourth electrode layer extending in the first direction;
- a second conductive layer surrounding the third electrode layer and the fourth electrode layer, and spaced from the first conductive layer in a second direction relative to the first conductive layer and along the surface of the substrate;

a third insulating layer provided between the third electrode layer and the second conductive layer, surrounding the third electrode layer, and including oxygen (O) and at least one of hafnium (Hf) or zirconium (Zr);

a fourth insulating layer provided between the fourth electrode layer and the second conductive layer, surrounding the fourth electrode layer, and including oxygen (O) and at least one of hafnium (Hf) or zirconium (Zr);

a second gate electrode layer extending in the first direction;

a second semiconductor layer surrounding the second gate electrode layer, electrically connected to the second conductive layer, and spaced from the first semiconductor layer; and a second gate insulating layer provided between the second gate electrode layer and the second semiconductor layer and surrounding the second gate electrode layer.

9. The memory device according to claim 8, wherein the first electrode layer is electrically connected to the third electrode layer, the second electrode layer is electrically connected to the fourth electrode layer, and the first gate electrode layer is electrically separated from the second gate electrode layer.

10. The memory device according to claim 8, further comprising a wiring layer electrically connected to the first semiconductor layer and the second semiconductor layer.

11. The memory device according to claim 8, further comprising:

a third conductive layer surrounding the first electrode layer and the second electrode layer, and spaced from the first conductive layer, and between the first conductive layer and the substrate;

a fifth insulating layer provided between the first electrode layer and the third conductive layer, surrounding the first electrode layer, and containing oxygen (O) and at least one of hafnium (Hf) or zirconium (Zr);

a sixth insulating layer provided between the second electrode layer and the third conductive layer, surrounding the second electrode layer, and including oxygen (O) and at least one of hafnium (Hf) or zirconium (Zr);

a third semiconductor layer surrounding the first gate electrode layer, electrically connected to the third conductive layer, and spaced from the first semiconductor layer; and a third gate insulating layer provided between the first gate electrode layer and the third semiconductor layer and surrounding the first gate electrode layer.

12. The memory device according to claim 1, wherein the first conductive layer extends in a third direction along the surface of the substrate, and has a first portion and a second portion, the first portion and the second portion are alternately provided in the third direction, and a width of the first portion in a second direction perpendicular to the third direction along the surface of the substrate is larger than a width of the second portion in the second direction.

13. The memory device according to claim 10, wherein the wiring layer extends in the second direction, and has a third portion and a fourth portion, the third portion and the fourth portion are alternately provided in the second direction, and a width of the third portion in a third direction perpendicular to the second direction along the surface of the substrate is larger than a width of the fourth portion in the third direction.

14. The memory device according to claim 1, wherein the first conductive layer presents a zigzag pattern.

15. The memory device according to claim 10, wherein the wiring layer presents a zigzag pattern.

16. The memory device according to claim 10, further comprising an insulating region extending in the first direction and surrounded by the wiring layer.

* * * * *